US012412778B2

(12) United States Patent
Su et al.

(10) Patent No.: US 12,412,778 B2
(45) Date of Patent: Sep. 9, 2025

(54) METHOD FOR REDUCING LINE END SPACING AND SEMICONDUCTOR DEVICES MANUFACTURED THEREOF

(71) Applicant: TAIWAN SEMICONDUCTOR MANUFACTURING COMPANY, LTD., Hsinchu (TW)

(72) Inventors: Yi-Nien Su, Hsinchu (TW); Yu-Yu Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1161 days.

(21) Appl. No.: 17/237,008

(22) Filed: Apr. 21, 2021

(65) Prior Publication Data

US 2022/0102198 A1    Mar. 31, 2022

Related U.S. Application Data

(60) Provisional application No. 63/084,303, filed on Sep. 28, 2020.

(51) Int. Cl.
*H01L 21/768*    (2006.01)
*H01L 21/033*    (2006.01)
*H01L 21/311*    (2006.01)

(52) U.S. Cl.
CPC .... *H01L 21/76802* (2013.01); *H01L 21/0338* (2013.01); *H01L 21/31144* (2013.01); *H01L 21/76829* (2013.01); *H01L 21/76877* (2013.01)

(58) Field of Classification Search
CPC ........... H01L 21/76802; H01L 21/0338; H01L 21/31144; H01L 21/76829; H01L 21/76877; H01L 21/28264; H01L 21/76811; H01L 21/76816; H01L 21/0332
See application file for complete search history.

(56) References Cited

U.S. PATENT DOCUMENTS

| | | | |
|---|---|---|---|
| 7,879,727 B2 * | 2/2011 | Postnikov | G03F 7/40 |
| | | | 257/E21.546 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,564,396 B2 * | 2/2017 | Kao | H01L 21/76897 |

(Continued)

FOREIGN PATENT DOCUMENTS

CN    103531526 A  *  1/2014  ....... H01L 21/76802
CN    110970305 A      4/2020

*Primary Examiner* — Ratisha Mehta
(74) *Attorney, Agent, or Firm* — NZ Carr Law Office

(57) ABSTRACT

Embodiments of the present disclosure provide methods for forming conductive lines with dielectric cut features. Particularly, embodiments of present disclosure provide a method for forming conductive line pattern using two patterning processes. A line pattern is formed in the first patterning process. A cut pattern is formed over the line pattern in the second patterning process. The cut pattern is formed by forming cut openings with a width smaller than the line width of the line pattern and then filling the cut opening with a mask material.

20 Claims, 23 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 10,727,113 B2 * | 7/2020 | Hsiao .............. H01L 21/823821 |
| 2007/0197014 A1 * | 8/2007 | Jeon .................... H01L 21/0337 |
| | | 438/597 |
| 2013/0309838 A1 | 11/2013 | Wei et al. |
| 2017/0234942 A1 * | 8/2017 | Lavangkul ............. G01R 33/04 |
| | | 324/253 |
| 2018/0040546 A1 | 2/2018 | Yu et al. |
| 2018/0047674 A1 | 2/2018 | Tsai et al. |
| 2019/0103305 A1 | 4/2019 | Liu et al. |
| 2020/0258754 A1 | 8/2020 | Lin et al. |
| 2020/0279806 A1 * | 9/2020 | Lin ................... H01L 21/76805 |

* cited by examiner

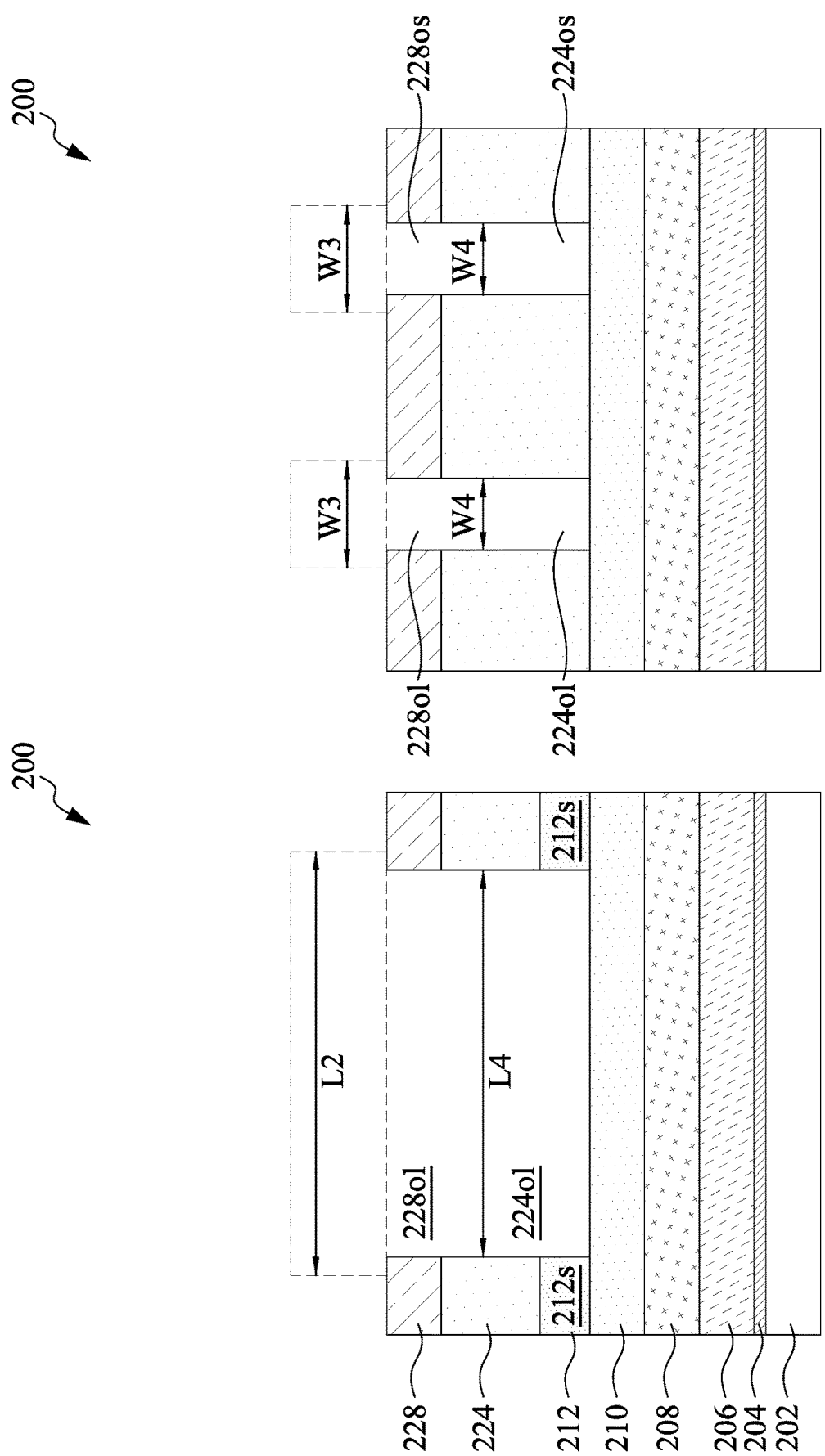

METHOD FOR REDUCING LINE END SPACING AND SEMICONDUCTOR DEVICES MANUFACTURED THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, the manufacture of these devices has approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
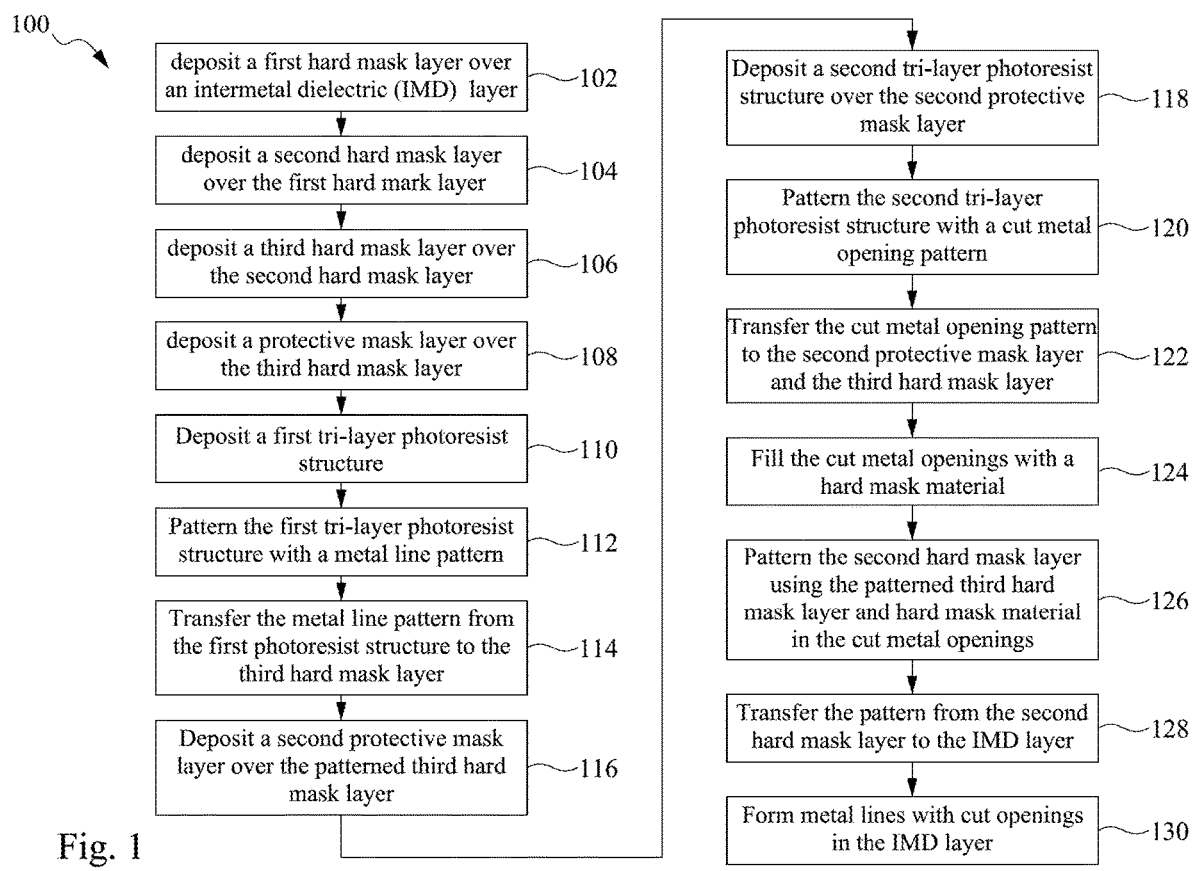
FIG. 1 is a flow chart of a method for manufacturing of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide methods for forming conductive lines with dielectric cut features. Particularly, embodiments of present disclosure provide a method for forming conductive line pattern by first forming a line pattern, then forming a cut pattern over the line pattern. The cut pattern may be formed by forming cut openings with a width smaller than the line width in the line pattern and then filling the cut opening with a mask material.

FIG. 1 is a flow chart of a method 100 for manufacturing of a semiconductor device according to embodiments of the present disclosure. Particularly, the method 100 relates to processes for forming conductive lines in a semiconductor device. FIGS. 2 to 6, FIGS. 7A-C to FIGS. 12A-C, FIGS. 13-14, and FIGS. 15A-C schematically illustrate a semiconductor device 200 at various stages of manufacturing according to the method 100. FIGS. 2-6, FIG. 7A-12A, FIGS. 13-14, FIG. 15A are schematic perspective view of the semiconductor device 200 at various intermediate stages of forming conductive lines. FIGS. 7B-12B and 15C are cross sectional view of the semiconductor device 200 along the line B-B shown in FIG. 6. FIGS. 7C-12C, and 15C are cross sectional view of the semiconductor device 200 along the line C-C shown in FIG. 6A.

The method 100 relates to patterning and forming conductive lines in a layer dielectric material. In some embodiments, the conductive lines may be part of a metallization structure or an interconnect structure of a semiconductor device. The conductive lines may be formed by an electrically conductive material, such as a metal. For example, the conductive lines formed using the techniques described herein may be used to form conductive interconnects as part of a Back End of Line (BEOL) process or a Front End of Line (FEOL) process.

In some embodiments, the semiconductor device 200 is processed as part of a larger wafer. A singulation process may be applied to scribe line regions of the wafer in order to separate individual semiconductor dies from the wafer.

Figure 2:
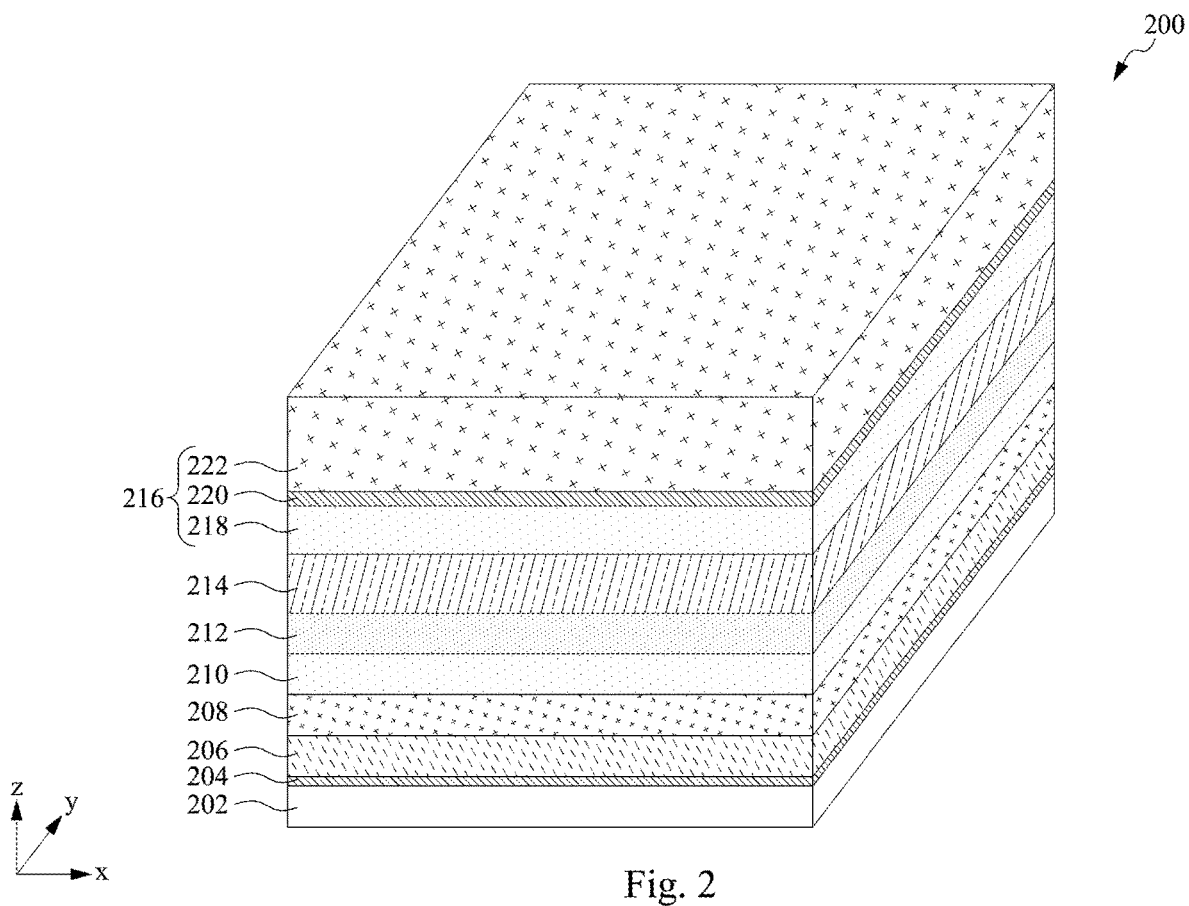
FIGS. 2 to 6, FIGS. 7A-C to FIGS. 12A-C, FIGS. 13-14, and FIGS. 15A-C schematically illustrate a semiconductor device according to the present disclosure at various stages of manufacturing.

As shown in FIG. 2, the semiconductor device 200 includes a substrate 202. In some embodiments, the substrate 202 includes various features formed thereon. For example, the substrate 202 may include active devices, interconnect structures, and the like.

The substrate 202 may include a semiconductor material such as silicon, doped or undoped, or an active layer of a semiconductor-on-insulator (SOI) substrate. The substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, for example planar transistors, field effect transistors (FETs), Fin-FETs, Horizontal Gate All Around (HGAA) FETs, Vertical Gate All Around (VGAA) FETs, diodes, capacitors, resistors, or other suitable devices, may be formed in and/or on an active surface of semiconductor material in the substrate 202. Interconnect structures, such as interlayer dielectric layers, etch stop layers, IMD layers, may also be included in the substrate 202.

The semiconductor device 200 may include a dielectric layer 206 formed over the substrate 202. Conductive lines are formed in the dielectric layer 206 according to the method 100 described herein.

In some embodiments, the dielectric layer 206 is an IMD layer. In some embodiments, the dielectric layer 206 may be formed over an inter-layer dielectric (ILD) layer on the substrate 202. In other embodiments, the dielectric layer 206 may be an ILD layer formed over source/drain regions or the gate of a transistor (e.g., a FinFET), a dielectric layer in an interconnect structure, or a dielectric layer used in other types of metallization structures. For example, the dielectric layer 206 may be an ILD layer formed over the fins, metal gates, or source/drain regions of one or more FinFETs formed in the substrate 202.

In some embodiments, the dielectric layer 206 includes one or more layers of dielectric material, for example, a nitride material such as silicon nitride (SiN), an oxide material such as silicon oxide (SiO), TEOS, BPTEOS, or the like. The dielectric layer 206 may also be a low-k dielectric material, a polymer material, other dielectric material, the like, or combinations thereof. The dielectric layer 206 may be formed by plasma enhanced chemical vapor deposition (PECVD), low pressure CVD (LPCVD), plasma vapor deposition (PVD), or the like.

In some embodiments, the dielectric layer 206 may be in physical contact with the substrate 202. In other embodiments, any number of intervening layers may be disposed between the dielectric layer 206 and the substrate 202. Such intervening layers may include IMD layers or dielectric layers, and may have contact plugs, conductive lines, and/or vias formed therein, or may include one or more intermediary layers, e.g., etch stop layers, adhesion layers, etc., combinations thereof, and the like.

In the example of FIG. 2, an optional etch stop layer 204 may be disposed directly under the dielectric layer 206. The etch stop layer 204 may, for example, act as a stop for an etching process subsequently performed on the dielectric layer 206. The material and processes used to form the etch stop layer 204 may depend on the material of the dielectric layer 206. In some embodiments, the etch stop layer 204 may be formed of SiN, SiON, SiCON, SiC, SiOC, SiCN, SiO, other dielectrics, the like, or combinations thereof. The etch stop layer 204 may be formed by plasma enhanced chemical vapor deposition (PECVD), low pressure CVD (LPCVD), plasma vapor deposition (PVD), or the like. Other materials and processes may be used to form the etch stop layer 204.

The method 100 may be used to patterning the dielectric layer 206 to form conductive lines with cut openings. In the example shown in FIGS. 2-15C, the conductive line pattern is formed in the dielectric layer 206 using two patterning processes. A first patterning process is performed to form mask strips. A second patterning process is followed to form cut features between the mask strips. The mask strips and the cut features are then transferred to the dielectric layer 206 to form line openings with end spacing corresponding to the cut features.

In operation 102 of the method 100, a first hard mask layer 208 is deposited on the dielectric layer 206, as shown in FIG. 2. In subsequent processing steps, a pattern is formed on the first hard mask layer 208 using patterning techniques described herein. The patterned first hard mask layer 208 is then used as an etching mask for patterning the dielectric layer 206. In some embodiments, a material composition of the first hard mask layer 208 may be selected to provide a high etch selectivity with respect to mask layers subsequently formed over the first hard mask layer 208. The first hard mask layer 208 may include more than one layer and include more than one material.

The first hard mask layer 208 may be formed of a material that includes an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or a combination. In some embodiments, when the dielectric layer 206 includes a low-k material, the first hard mask layer 208 may be formed from an oxide material, or silicon nitride.

The first hard mask layer 208 may be formed using a process such as CVD, ALD, or the like. In some embodiments, the first hard mask layer 208 has a thickness between about 100 angstroms and about 200 angstroms. In other embodiments, the first hard mask layer 208 may have another thickness suitable for critical dimension of the features to be patterned in the dielectric layer 206 and the first hard mask layer 208.

In operation 104 of the method 100, a second hard mask layer 210 is formed over the first hard mask layer 208, as shown in FIG. 2. In subsequent processing steps, a pattern is formed on the second hard mask layer 210 using patterning techniques described herein. The second hard mask layer 210 may be formed of a material that includes an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or a combination.

As discussed below, the second hard mask layer 210 is used as an etching mask for etching the first hard mask layer 208 and transferring the pattern of the second hard mask layer 210 to the first hard mask layer 208. The second hard mask layer 210 may be formed from a material different from the first hard mask layer 208. Alternatively, the first hard mask layer 208 may include more than one layer and include more than one material and may include a material different from the second hard mask layer 210. In some embodiments, when the first hard mask layer 208 includes an oxide material, or silicon nitride, the second hard mask layer 210 may be formed from titanium nitride, tungsten, silicon, titanium oxide, or a metal oxide.

The second hard mask layer 210 may be formed by a process such as CVD, ALD, or the like. Other processes and materials may be used to form the second hard mask layer 210. In some embodiments, the second hard mask layer 210 has a thickness between about 100 angstroms and about 300 angstroms. In other embodiments, the second hard mask layer 210 may have another thickness suitable for critical dimension of the features to be patterned in the dielectric layer 206, in the first hard mask layer 208, or in the second hard mask layer 210.

In operation 106 of the method 100, a third hard mask layer 212 is formed over the second hard mask layer 210, as shown in FIG. 2. In subsequent processing steps, a pattern is formed on the third hard mask layer 212 using patterning techniques described herein. The patterned third hard mask layer 212 is then used as an etching mask for patterning the second hard mask layer 210.

The third hard mask layer 212 may be formed from a material including an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or a combination. The third hard mask layer 212 may include more than one layer and include more than one material, and may include a material different from the second hard mask layer 210. In some embodiments, when the second hard mask layer 210 includes titanium nitride, tungsten, silicon, titanium oxide, or a metal oxide, the third hard mask layer 212 may be formed from an oxide material, or silicon nitride.

The third hard mask layer 212 may be formed using a process such as CVD, ALD, or the like. In some embodiments, a material composition of the third hard mask layer 212 may be determined to provide a high etch selectivity with respect to other layers such as the first hard mask layer 208, the second hard mask layer 210, a protective mask layer 214 described below, or other layers.

In some embodiments, the third hard mask layer 212 has a thickness between about 100 angstroms and about 300 angstroms. In other embodiments, the third hard mask layer 212 may have another thickness suitable for critical dimension of the features to be patterned in the dielectric layer 206, in the first hard mask layer 208, in the second hard mask layer 210, or in the third hard mask layer 212.

In operation 108 of the method 100, the protective mask layer 214 is formed over the third hard mask layer 212, as shown in FIG. 2. In subsequent processing steps, a pattern is formed on the protective mask layer 214 using patterning techniques described herein. The patterned protective mask layer 214 is then used as an etching mask for patterning the third hard mask layer 212.

The protective mask layer 214 may be formed from a suitable dielectric material. In some embodiments, the protective mask layer 214 is a layer of a carbon material, such as a carbon-containing polymer material, e.g., a spin-on-carbon (SOC) material or the like, a layer of carbon deposited using a CVD process, or another type of carbon material. The protective mask layer 214 may include more than one layer and include more than one material.

The protective mask layer 214 may be formed by a suitable process, such as CVD, ALD, Plasma-Enhanced Atomic Layer Deposition (PEALD), spin-on coating, or the like. In some embodiments, the protective mask layer 214 has a thickness between about 200 angstroms and about 500 angstroms. In other embodiments, the protective mask layer 214 may have another thickness suitable for critical dimension of the features to be patterned in the dielectric layer 206, in the first hard mask layer 208, in the second hard mask layer 210, in the third hard mask layer 212, or in the protective mask layer 214.

In operation 110 of the method 100, a photoresist structure 216 is formed over the protective mask layer 214, as shown in FIG. 2. In one embodiment, the photoresist structure 216 may be selected to be suitable for an extreme ultraviolet (EUV) photolithography. The photoresist structure 216 shown in FIG. 2 includes an anti-reflection coating (ARC) layer 218 formed over the protective mask layer 214, a backside anti-reflective coating (BARC) layer 220 formed over the ARC layer 218, and a photoresist layer 222 formed over the BARC layer 220. The photoresist structure 216 may be referred to as tri-layer photoresist structure. In other embodiments, one or both of the ARC layer 218 and BARC layer 220 may be omitted forming a double-layer photoresist structure, or a mono-layer photoresist structure.

The ARC layer 218 may be a material such as silicon oxycarbide (SiOC), silicon, silicon oxynitride, titanium oxide, silicon oxide, silicon nitride, a polymer, or a combination thereof. The ARC layer 218 contains a material that is patternable and/or has a composition tuned to provide anti-reflection properties. The ARC layer 218 may be formed by a spin coating process. In other embodiments, the ARC layer 218 may be formed by another suitable deposition process. The ARC layer 218 may have a thickness between about 50 angstroms and about 300 angstroms.

The BARC layer 220 may have a composition that provides anti-reflective properties and/or hard mask properties for the lithography process. In one embodiment, the BARC layer 220 includes a silicon containing layer, e.g., silicon hard mask material. The BARC layer 220 may include a silicon-containing inorganic polymer. In other embodiment, the BARC layer 220 includes a siloxane polymer, e.g., a polymer having a backbone of O—Si—O—Si. The silicon ratio of the BARC layer 220 may be selected to control the etch rate. In other embodiments, the BARC layer 220 may include silicon oxide, e.g., spin-on glass (SOG), silicon nitride, silicon oxynitride, polycrystalline silicon, a metal-containing organic polymer material that contains metal such as titanium, titanium nitride, aluminum, and/or tantalum; and/or other suitable materials. The BARC layer 220 may be omitted when there is a good adhesion between the ARC layer 218 and the photoresist layer 222. The BARC layer 220 may have a thickness between about 50 angstroms and about 300 angstroms.

The photoresist layer 222 may be a positive photoresist layer or a negative photoresist layer. In some embodiments, the photoresist layer 222 is made of Poly methyl methacrylate (PMMA), poly methyl glutarimide (PMGI), Phenol formaldehyde resin (DNQ/Novolac) or SU-8. In one embodiment, the photoresist layer 222 may have a thickness between about 200 angstroms and about 500 angstroms.

Figure 3:
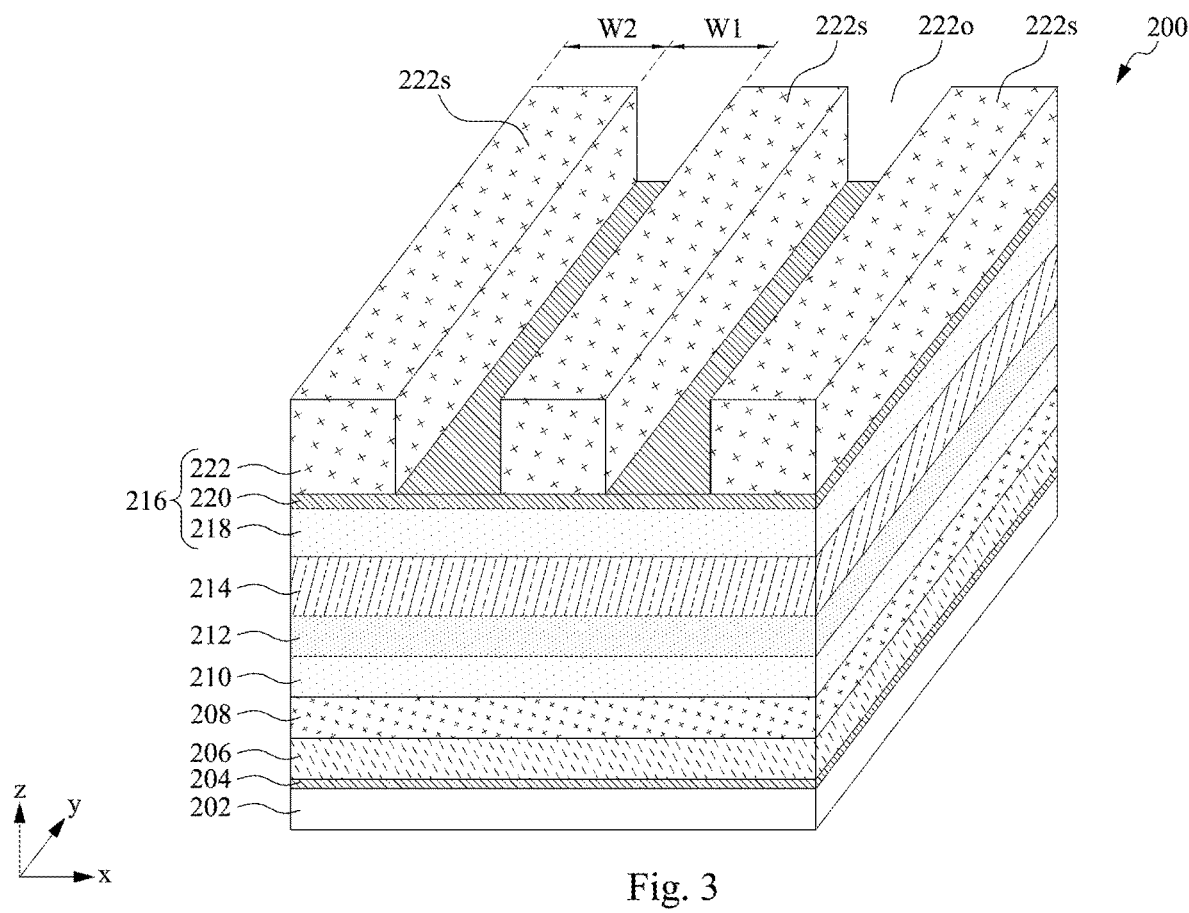

In operation 114 of the method 100, the photoresist layer 222 is patterned using a photolithography process, as shown FIG. 3. In some embodiments, the photoresist layer 222 may be patterned using an extreme ultraviolet (EUV) lithography process, which uses extreme ultraviolet radiation or soft x-ray, i.e. radiation with wavelength shorter than 130 nm.

As shown in FIG. 3, the photoresist layer 222 is patterned to form a plurality of photoresist strips 222s separated by a plurality of openings 222o. The plurality of openings 222o expose the BARC layer 220 if present or the ARC layer 218 if the BARC layer 220 is not present.

The openings 222o may be parallel to each other. Adjacent openings 222o may be separated by the photoresist strips 222s. In some embodiments, the openings 222o and the photoresist strips 222s may extend lengthwise along the Y-axis. Each of the openings 222o may have a width W1 that is perpendicular to the lengthwise direction, i.e. along the X-axis. Each of the plurality of photoresist strips 222s may have a width W2 along the X-axis.

In some embodiments, the openings 222o correspond to openings for conductive lines to be formed in the dielectric layer 206. The width W1 of the openings 222o corresponds to the minimal line width, i.e. line width CD, of the semiconductor device to be formed. In some embodiments, the width W1 is between about 15 nm and about 25 nm. The width W2 of the photoresist strips 222s corresponds to the minimal line to line spacing, i.e. line to line spacing CD, of the semiconductor device to be formed. In some embodiments, the width W2 is between about 15 nm and about 25 nm.

Even though a single photolithographic patterning process is described in the operation 112, two or more photolithographic patterning processes, i.e., multi-patterning, may be used to allow for a smaller pitch of patterned features.

Other photolithographic techniques, including additional or different steps, are within the scope of this disclosure.

Figure 4:
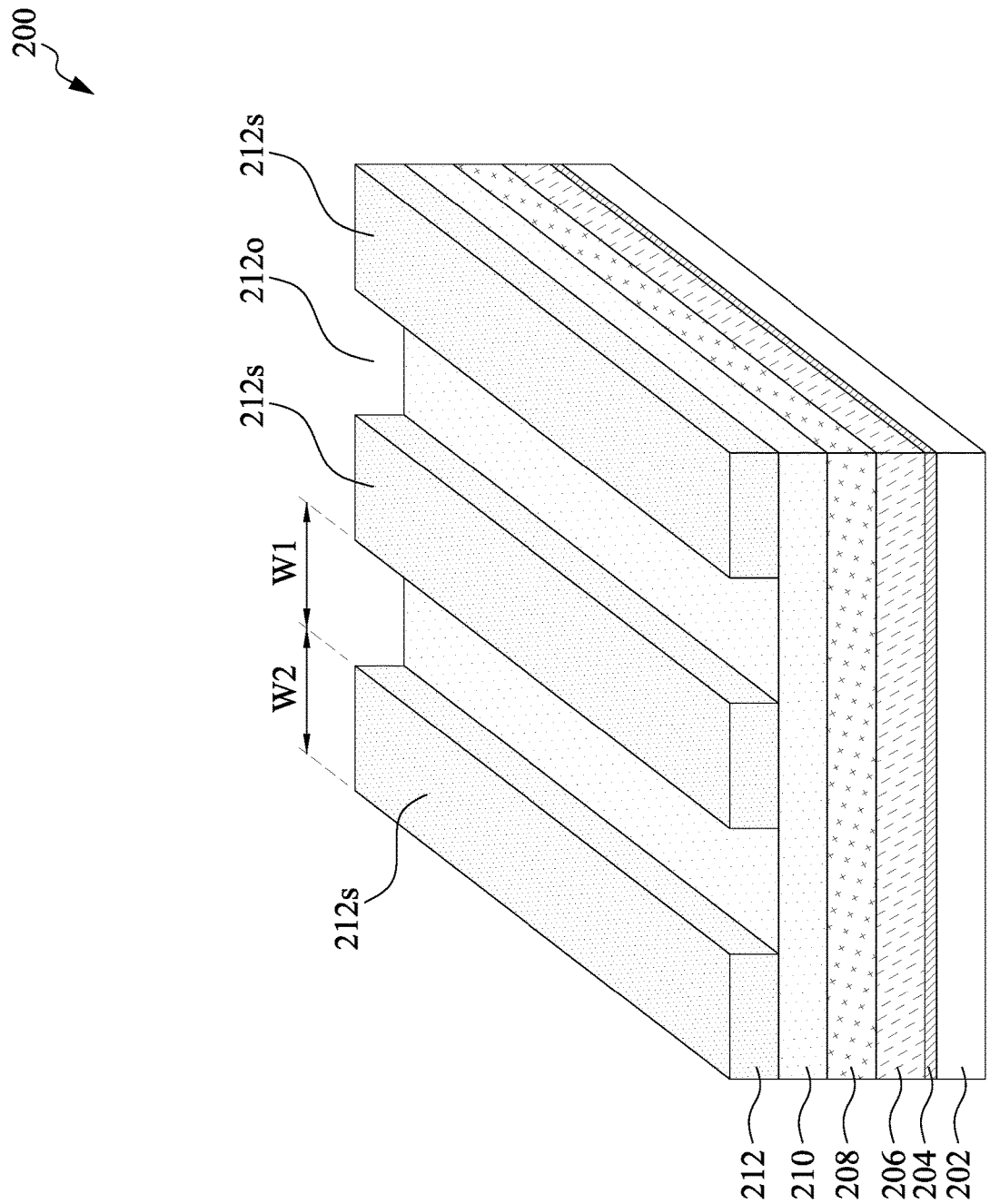

In operation 114 of the method 100, the pattern of the photoresist layer 222 is transferred to the third hard mask layer 212, as shown in FIG. 4. In some embodiments, the pattern of the photoresist layer 222 is transferred to the third hard mask layer 212 using one or more anisotropic etching processes to etch through the BARC layer 220, the ARC layer 218, the protective mask layer 214, and the third hard mask layer 212, sequentially.

In some embodiments, the BARC layer 220 is patterned using the patterned photoresist layer 222 as a mask. As a result, the pattern of the photoresist layer 222 is transferred to the BARC layer 220 forming a patterned BARC layer 220. After the BARC layer 220 is patterned, the ARC layer 218 is patterned using the patterned BARC layer 220. The BARC layer 220 and the ARC layer 218 may be patterned using plasma processes, for example by plasma with one or more process gases such as $CF_4$, $CH_2F_2$, $CH_3F$, $CHF_3$, $Cl_2$, Ar, $O_2$, $N_2$, $NH_3$, $H_2$, another type of process gas, or a combination thereof. The etching process may be anisotropic, so that the openings 222o in the photoresist layer 222 are extended through the ARC layer 218 and have about the same sizes in the ARC layer 218 as they do in the photoresist layer 222.

The pattern of the ARC layer 218 is then transferred to the protective mask layer 214 in an etching process. The etching process may be anisotropic, so that the openings in the ARC layer 218 are extended through the protective mask layer 214 and have about the same sizes in the protective mask layer 214 as in the ARC layer 218. The etching process that etches the protective mask layer 214 may include a wet etching process, a dry etching process, or a combination thereof. The plasma etching process may include one or more process gases such as $CF_4$, $CH_2F_2$, $CH_3F$, $CHF_3$, $Cl_2$, Ar, $O_2$, another type of process gas, or a combination thereof. For example, in some embodiments, fluorine-comprising process gases such as $CF_4$, $CH_2F_2$, $CH_3F$, or $CHF_3$ may be used to etch layers formed from some dielectric materials, and chlorine-comprising process gases such as $Cl_2$ may be used to etch layers formed from materials such as Si or TiN. Other etching techniques may be used in other embodiments. During the etching of the protective mask layer 214, the patterned ARC layer 218 may be consumed, and third hard mask layer 212 may be at least partially consumed.

The pattern of the protective mask layer 214 is transferred to the third hard mask layer 212 in an etching process. The etching process may be anisotropic, so that the openings in the protective mask layer 214 are extended through the third hard mask layer 212 and have about the same sizes in the third hard mask layer 212 as they do in the protective mask layer 214. As shown in FIG. 4, after operation 114, a plurality of mask strips 212s are formed in the third hard mask layer 212. Neighboring mask strips 212s are separated by openings 212o formed through the third hard mask layer 212. The openings 212o have about the same size of the opening 222o. The mask strips 212s have about the same size of the photoresist strips 222s.

The etching process that etches the third hard mask layer 212 may include a wet etching process, a dry etching process, or a combination thereof. The plasma etching process may include one or more process gases such as $CF_4$, $CH_3F$, $C_4F_6$, $C_4F_8$, other suitable gas, or a combination thereof. Other etching techniques may be used in other embodiments.

After the etching of the third hard mask layer 212, portions of the protective mask layer 214 may remain. In some embodiments, the remaining portions of the protective mask layer 214 may be removed using, for example, a wet etching process. In other embodiments, the remaining portions of the protective mask layer 214 are left remaining over the patterned third hard mask layer 212, for example, to be used as a protective layer.

Figure 5:
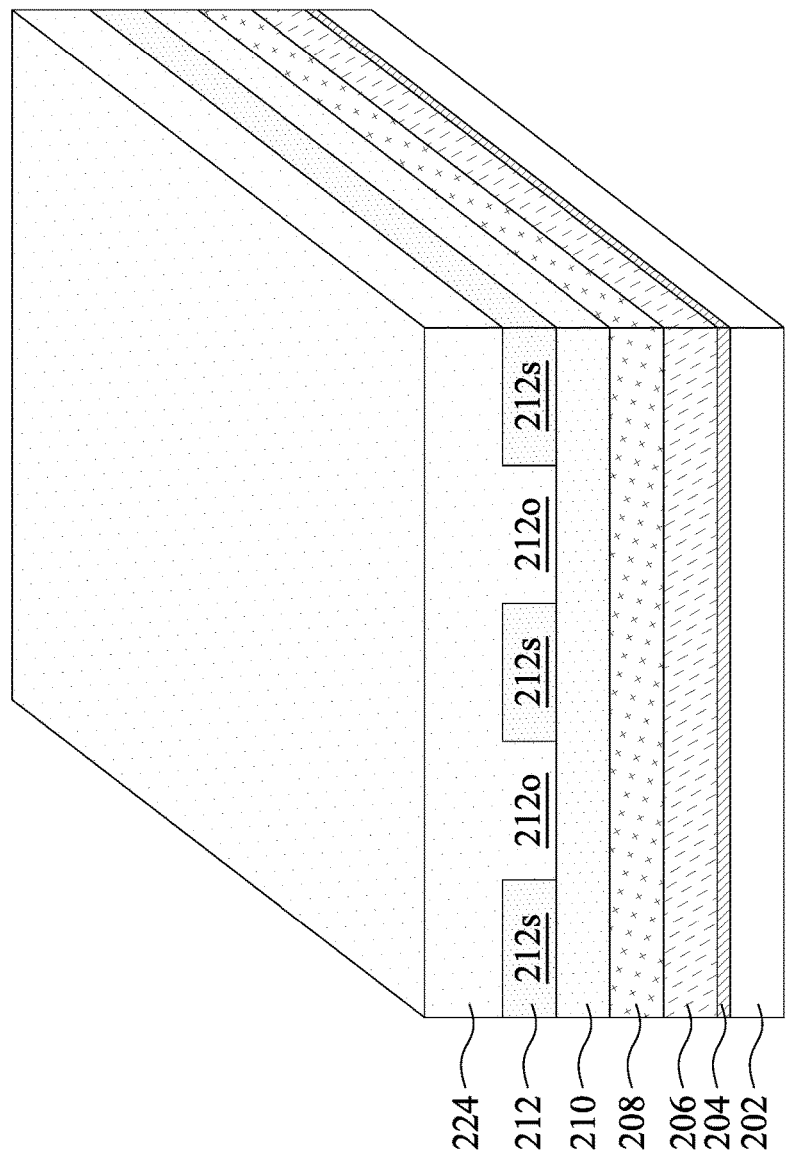

In operation 116 of the method 100, a second protective mask layer 224 is deposited over the patterned third mask layer 212, as shown in FIG. 5. The openings 212o, formed in operation 114, in the third mask layer 212 is filled with material of the second protective mask layer 224.

The second protective mask layer 224 may be similar to the protective mask layer 214. The second protective mask layer 224 is a layer of a carbon material, such as a carbon-containing polymer material, e.g., SOC material or the like, a layer of carbon deposited using a CVD process, or another type of carbon material. The second protective mask layer 224 may be formed by a suitable process, such as CVD, ALD, PEALD, spin-on coating, or the like. In some embodiments, the second protective mask layer 224 has a thickness between about 200 angstroms and about 500 angstroms. In some embodiments, the thickness of the second protective mask layer 224 is measured from a top surface of the third mask layer 212. In other embodiments, the second protective mask layer 224 may have another thickness suitable for critical dimension of the features to be patterned in the dielectric layer 206, in the first hard mask layer 208, in the second hard mask layer 210, in the third hard mask layer 212, or in the second protective mask layer 224.

Figure 6:
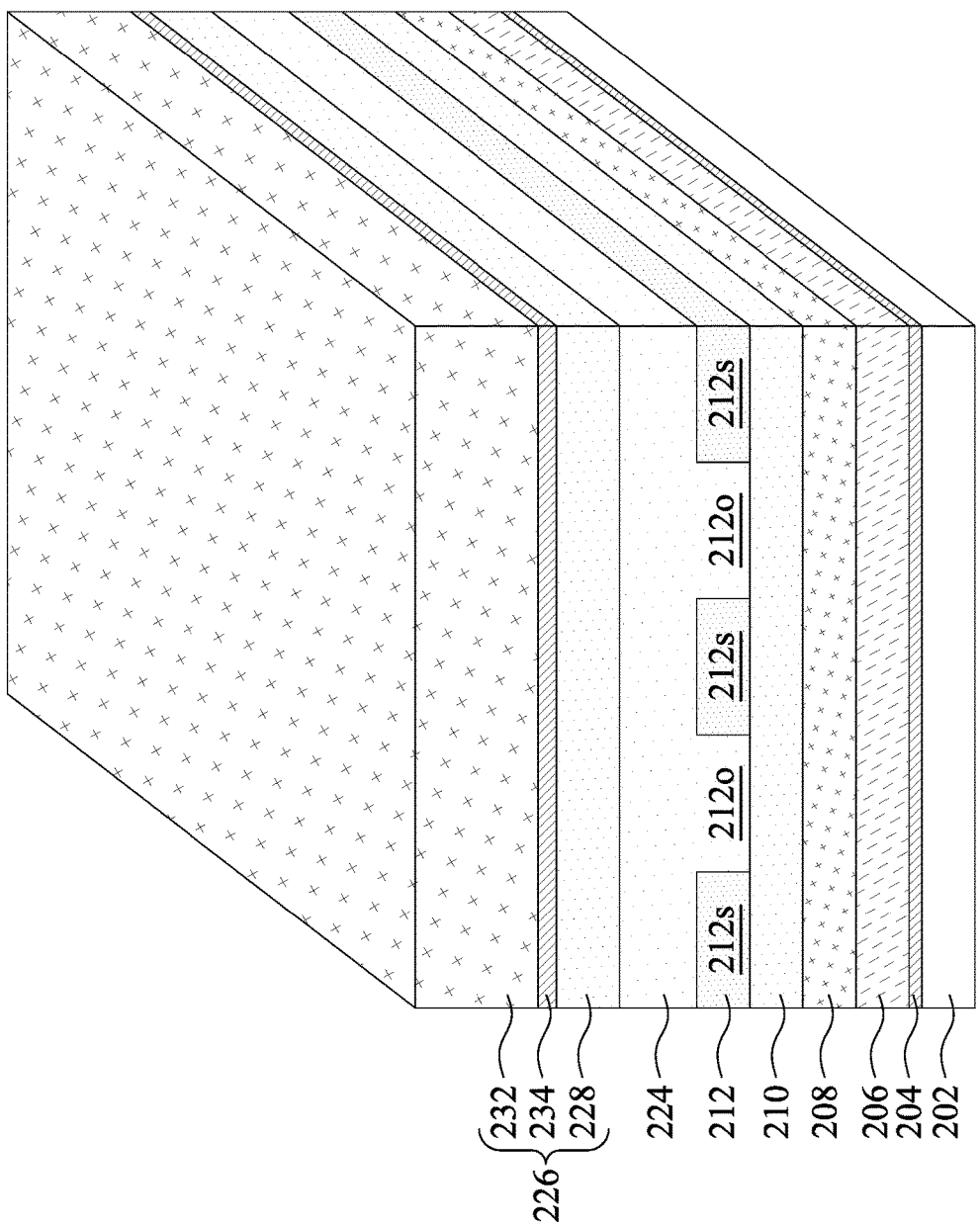

In operation 118 of the method 100, a second photoresist structure 226 is formed over the second protective mask layer 224, as shown in FIG. 6. The photoresist structure 226 may be similar to the photoresist structure 216. In one embodiment, the photoresist structure 226 is a tri-layer photoresist including an ARC layer 228, a BARC layer 230, and a photoresist layer 232.

The ARC layer 228 may be a material such as SiOC, silicon, silicon oxynitride, titanium oxide, silicon oxide, silicon nitride, a polymer, or a combination. The ARC layer 228 may have a thickness between about 50 angstroms and about 300 angstroms.

The BARC layer 230 may have a composition that provides anti-reflective properties and/or hard mask properties for the lithography process. In one embodiment, the BARC layer 230 includes a silicon containing layer, e.g., silicon hard mask material. The BARC layer 230 may have a thickness between about 50 angstroms and about 300 angstroms.

The photoresist layer 232 may be a positive photoresist layer or a negative photoresist layer. In some embodiments, the photoresist layer 232 is made of PMMA, PMGI, Phenol formaldehyde resin (DNQ/Novolac) or SU-8. In one embodiment, the photoresist layer 232 may have a thickness between about 200 angstroms and about 500 angstroms.

Figure 7A:
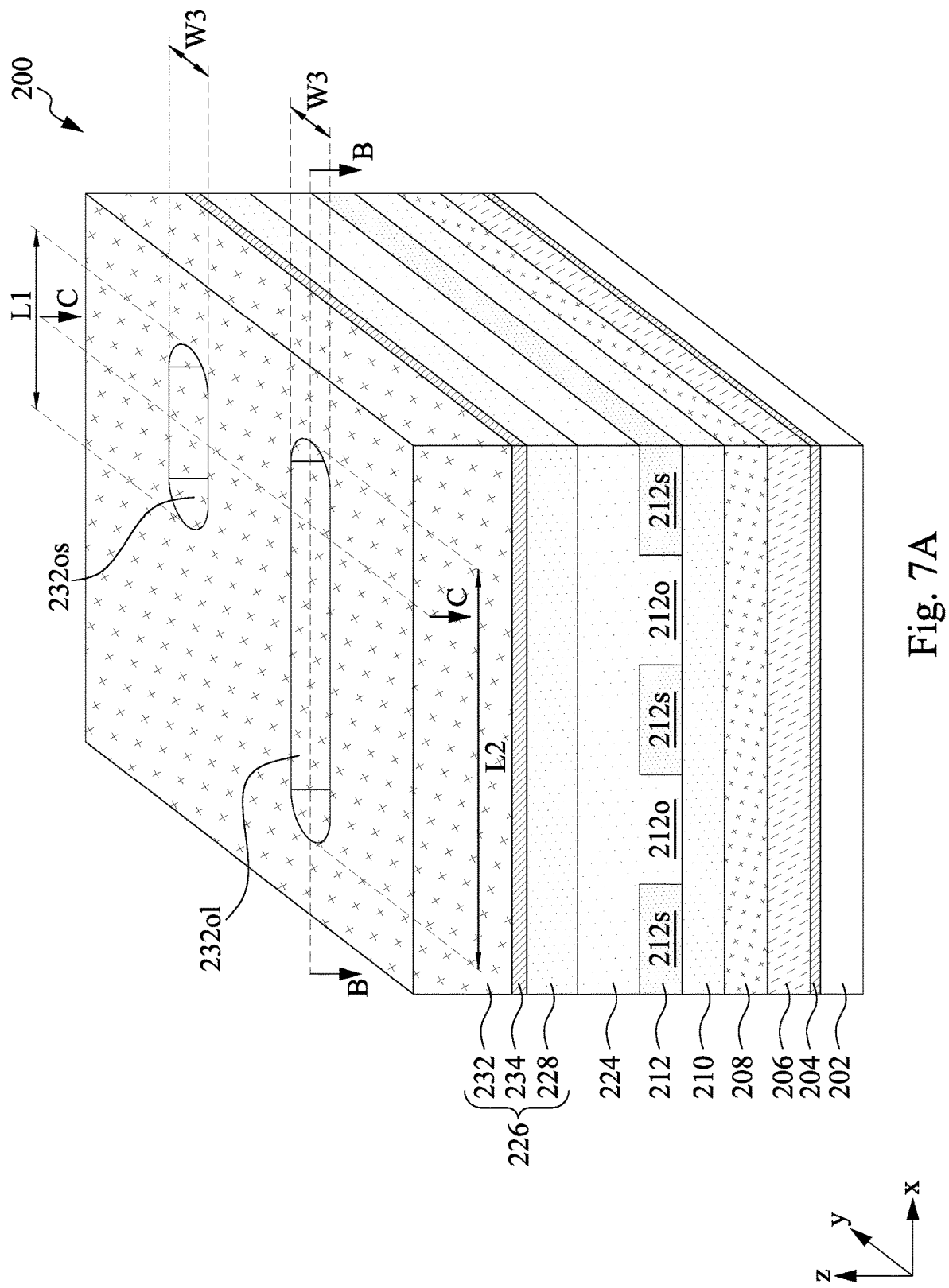
Figures 7B, 7C:
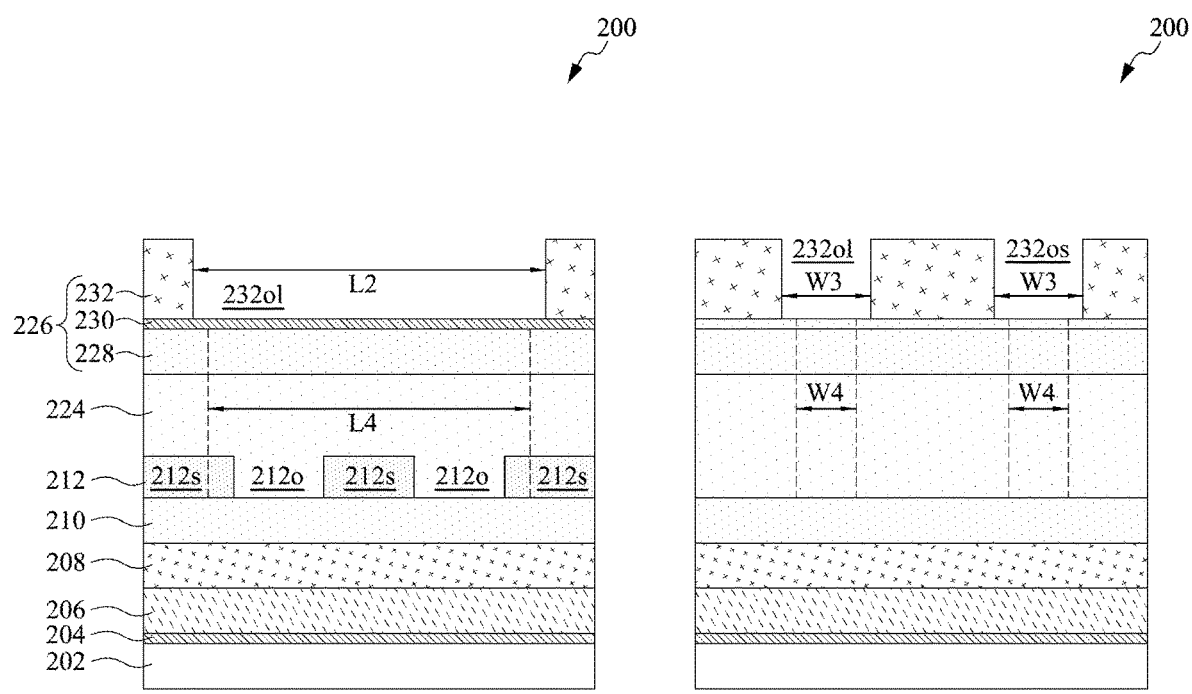

In operation 120 of the method 100, the photoresist layer 232 is patterned using a photolithography process to form one or more cut openings, as shown FIGS. 7A-C. In some embodiments, the photoresist layer 232 may be patterned using an EUV lithography process.

As shown in FIG. 7A, the photoresist layer 232 is patterned to form one or more cut openings 232ol, 232os. The cut openings 232ol, 232os expose the BARC layer 230 if present or the ARC layer 228 if the BARC layer 230 is not present.

In some embodiments, the cut openings 232ol, 232os may extend lengthwise along the X-axis. The cut openings 232ol, 232os may have varied length L1, L2 respectively along the X-axis. The cut openings 232ol, 232os may have substantially the same width W3, that is perpendicular to the lengthwise direction, e.g., along the Y-axis.

The cut openings 232ol, 232os in the photoresist layer 232 are intended to facilitate cut features between the mask strips 212s in the third hard mask layer 212. Accordingly, the cut openings 232ol, 232os are formed in locations corresponding to line end spacings between the adjacent conductive lines to be formed in the dielectric layer 206. Each cut opening 232ol, 232os, may extend lengthwise along the X-axis across one or more openings 212o, which are formed in the third hard mask layer 212 and filled with materials of the second protective mask layer 224. In some embodiments, each cut opening 232ol, 232os, also would intersect with the mask strips 212s on both sides of the openings 212o. As shown in FIG. 7B, the cut opening 232ol extends along the X-axis covering two openings 212o and intersecting with three of the mask strips 212s. The cut opening 232os, crossing one opening 212o, would facilitate formation of a cut feature for a single conductive line. The cut opening 232ol, crossing two openings 212o, would facilitate formation of cut features in two neighboring conductive lines. Cut openings of longer length and crossing more openings 212o may be formed according to the circuit layout.

In some embodiments, the width W3 of the cut openings 232ol, 232os is formed wider than the intended width of the cut features to be formed in the dielectric layer 206. In some embodiments, the width W3 may be similar to the line width CD of the conductive lines to be formed, or the line width W1 of the openings 212o. As discussed below, during subsequent pattern transferring, the width of the cut openings will reduce from the width of the cut openings in the photoresist layer 232 to a desirable narrower width in the third hard mask layer 212 and the second protective mask layer 224, therefore, reducing line-end spacing between the conductive lines to be formed. As shown in FIG. 7C, the width of cut openings to be formed in the third hard mask layer 212 and the second protective mask layer 224 have a width W4, which is narrower the width W3 of the cut openings 232ol, 232os. In some embodiments, the width W4 is in a range less than about 50% of the width W1 of the openings 212o.

In some embodiments, lengths of the cut openings in the photoresist layer 232 may also be longer than intended length of cut openings to be formed in the third hard mask layer 212 and the second protective mask layer 224. As shown in FIG. 7B, the length L2 of the cut opening 232ol is longer than intended length L3 of cut openings to be formed in the third hard mask layer 212 and the second protective mask layer 224. The added length in the cut openings 232ol, 232os would provide tolerance for size reduction in the subsequent pattern transfer operations.

Figure 8A:
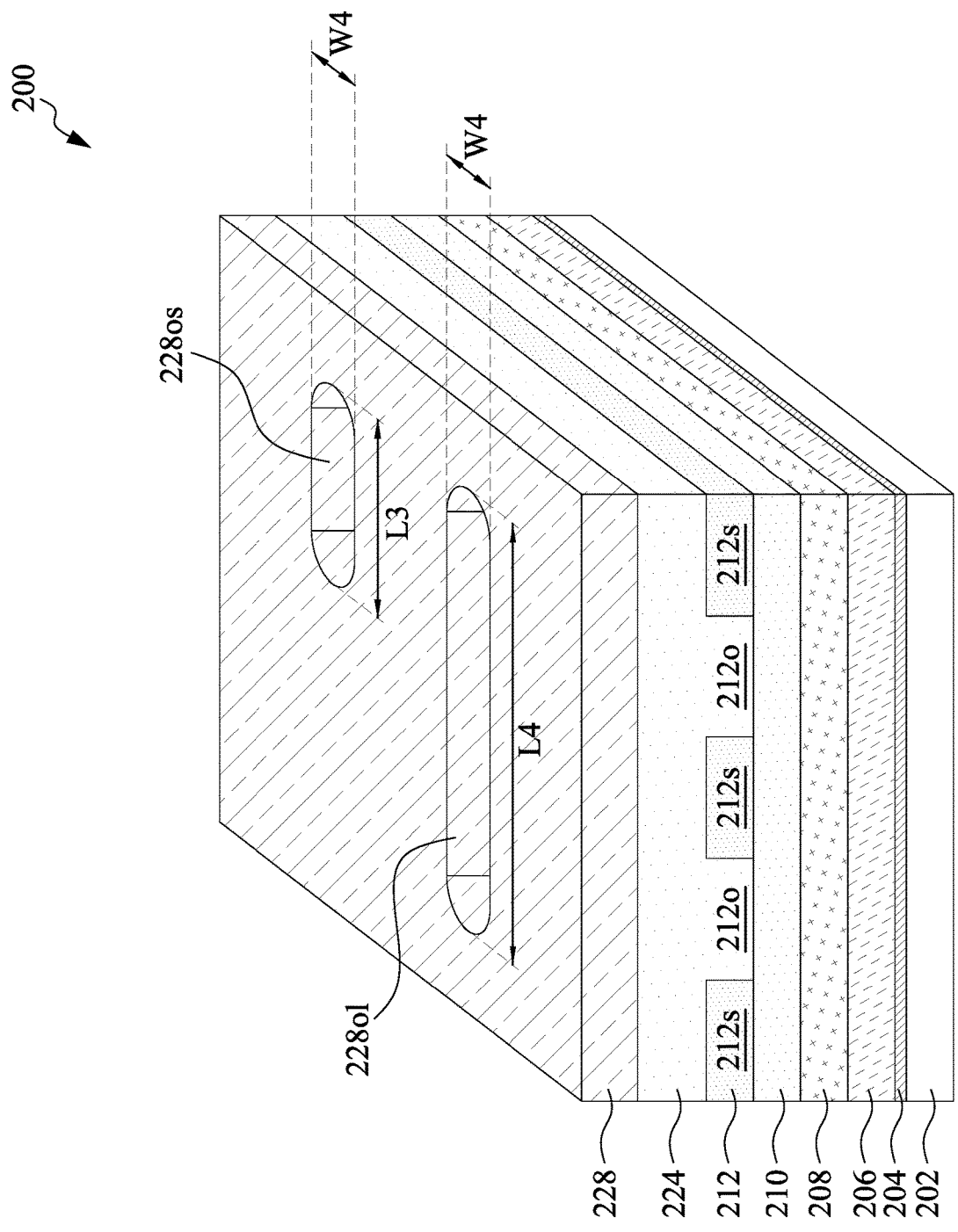

In operation 122 of the method 100, the pattern of the photoresist layer 232 is transferred to the third hard mask layer 212, as shown in FIGS. 8A-C. In some embodiments, the pattern of the photoresist layer 232 is transferred to the third hard mask layer 212 using one or more etching processes to etch through the BARC layer 230, the ARC layer 228, the second protective mask layer 224, and the third hard mask layer 212, sequentially.

In some embodiments, width of cut openings is reduced from the width W3 of the cut openings 232ol, 232os to the width W4 during one or more steps of pattern transfer from the photoresist layer 232 to the second protective mask layer 224. In some embodiments, lengths of the cut openings are reduced accordingly during one or more steps of pattern transfer from the photoresist layer 232 to the second protective mask layer 224.

In the embodiment shown in FIGS. 8A-C, width of the cut openings is reduced from the width W3 of the cut openings 232ol, 232os to the width W4 of cut openings 228ol during pattern transfer from the photoresist layer 232 to the ARC layer 228. Alternatively, the pattern transfer from the photoresist layer 232 to the ARC layer 228 may be an anisotropic etch for a direct pattern transfer, while the width of the cut openings is reduced during the pattern transfer from the ARC layer 228 to the second protective mask layer 224. In another embodiment, both of the pattern transfer from the photoresist layer 232 to the ARC layer 228 and the pattern transfer from the ARC layer 228 to the second protective mask layer 224 reduce the width of the cut openings.

In some embodiments, the BARC layer 230, if present, is patterned using the patterned photoresist layer 232 as a mask. As a result, the pattern of the photoresist layer 232 is transferred to the BARC layer 230 forming a patterned BARC layer 230. The BARC layer 230 may be patterned using plasma processes, for example by plasma with one or more process gases such as $CF_4$, $CH_2F_2$, $CH_3F$, $CHF_3$, $Cl_2$, Ar, $O_2$, $N_2$, $NH_3$, $H_2$, another type of process gas, or a combination thereof.

The ARC layer 228 is patterned using the patterned photoresist layer 232 or patterned BARC layer 230 if present. In some embodiments, the ARC layer 228 may be patterned using plasma processes, for example by plasma with one or more process gases such as $CF_4$, $CH_2F_2$, $CH_3F$, $CHF_3$, $Cl_2$, Ar, $O_2$, $N_2$, $NH_3$, $H_2$, another type of process gas, or a combination thereof.

In some embodiments, the etching gas may include two or more etchants with different etching properties to control the dimension of the openings formed in the ARC layer 228 relative to the dimension of the openings in the etching mask, such as the patterned photoresist layer 232 and/or the patterned BARC layer 230. In some embodiments, the etching gas includes a direct etching agent and a dimension reduction etching agent. The direct etching agent, when used alone transfers a pattern directly from the mask to the layer being etched. The dimension reduction etching agent, when used alone, forms openings with reduced dimensions compared to the features in the mask. The ratio of the direct etching agent and the dimension reduction etching agent can be adjusted to achieve a target dimension reduction. In some embodiments, the direct etching agent includes $CF_4$ and the dimension reduction etching agent includes $CHF_3$. The ratio of the $CF_4$ and $CHF_3$ in the etching gas is selected to achieve a desired ratio of opening width reduction.

As shown in FIGS. 8A-8C, cut openings 228ol, 228os are formed through the ARC layer 228. The width W4 of the cut openings 228ol, 228os is smaller than the width W3 of the cut openings 232ol, 232os. In some embodiments, the ratio of the width W4 and the width W3 is in a range between 80% and 40%. In some embodiments, lengths L3, L4 of the cut openings 228os, 228ol also reduces by similar dimension. For example, if the width W4 of cut openings 228os, 228ol is 12 nm narrower than the width W3 of the cut openings 232ol, 232os, the length L3, L4 of the cut openings 228os, 228ol is about 12 nm shorter than the length L1, L2 of the cut openings 232ol, 232os respectively. The etching gas may include $CF_4$ and $CHF_3$. The ratio of $CF_4$ and $CHF_3$ is selected to achieve a desired width reduction. In some embodiments, the ratio of $CF_4$ and $CHF_3$ is in a range between about 1:0.2 to about 0.8:1. A higher ratio of $CF_4$ and $CHF_3$ corresponds to a higher ratio of the width W4 over the width W3. For example, when the ratio of $CF_4$ and $CHF_3$ is about 1:0, the ratio of the width W4 over the width W3 is about 100%. When the ratio of $CF_4$ and $CHF_3$ is about 1:1, the ratio of the width W4 over the width W3 is about 50%.

The pattern of the ARC layer 228 is then transferred to the second protective mask layer 224 by an etching process. The etching process may be anisotropic, so that the cut openings 228ol, 228os in the ARC layer 228 are extended through the second protective mask layer 224 forming cut openings 224ol, 224os. The cut openings 224ol, 224os expose portions of the mask strips 212s and the second hard mask layer 210 in areas corresponding to the openings 212o. The etching process that etches the second protective mask layer 224 may include a wet etching process, a dry etching process, or a combination thereof. In some embodiments, a dry etching process may be a plasma etching process using one or more process gases such as $CF_4$, $CH_2F_2$, $CH_3F$, $CHF_3$, $Cl_2$, Ar, $O_2$, another type of process gas, or a combination.

In some embodiments, the exposed portions of the mask strips 212s may be removed during the etching process of the ARC layer 228. In other embodiments, etching process to remove the exposed portion of the mask strips 212s may be omitted leaving the exposed portions of the mask strips 212s as part of the mask to be formed in the subsequent operations.

In operation 124, cut mask 234 is formed within the cut openings 228ol, 228os in the ARC layer 228 and the cut openings 224ol, 224os in the second protective mask layer 224, as shown in FIGS. 9A-C and 11A-C.

Figure 9A:
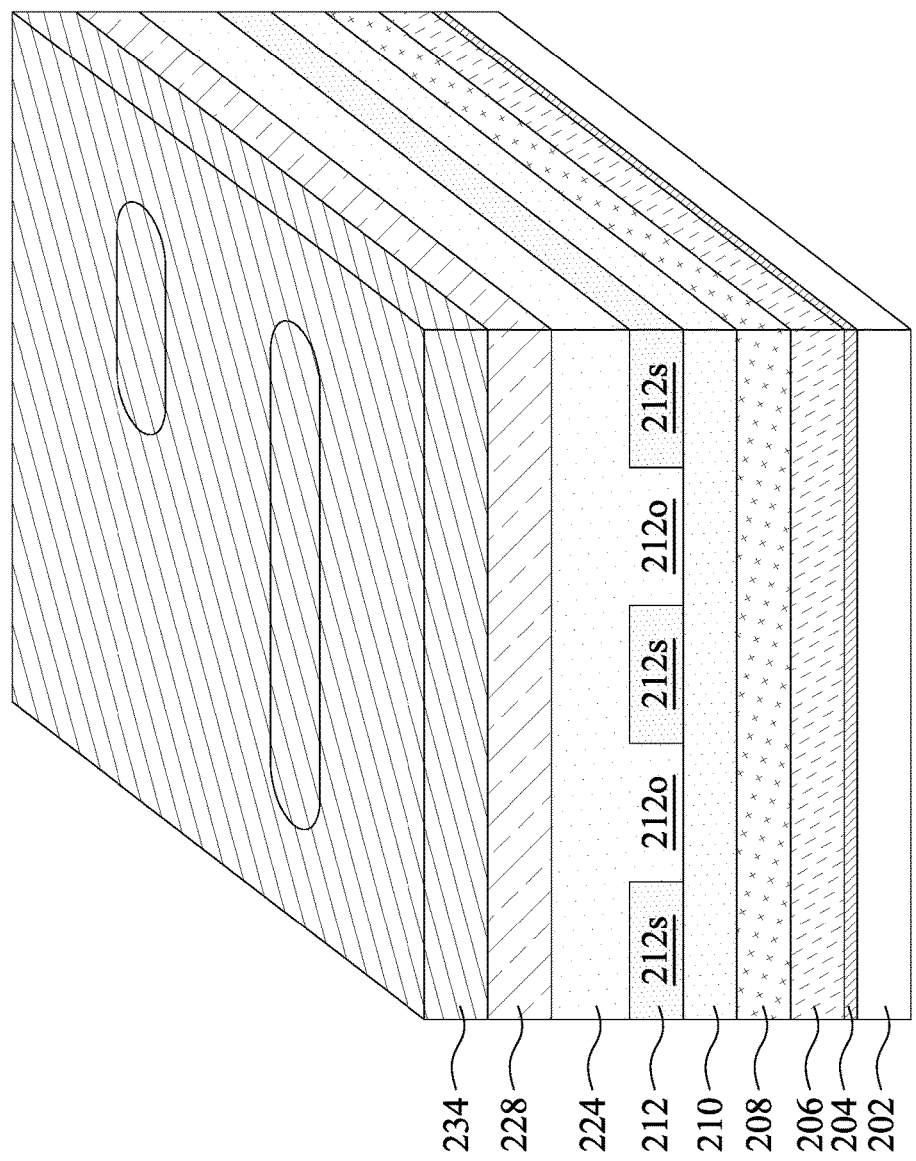
Figure 9C:
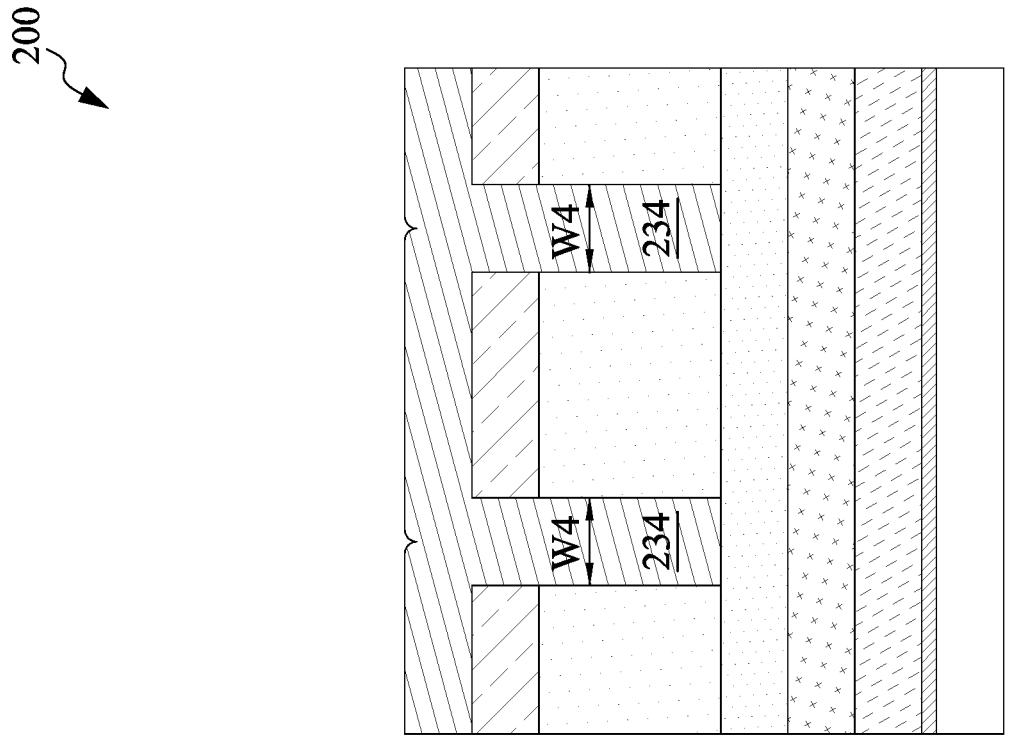
Figure 9B:
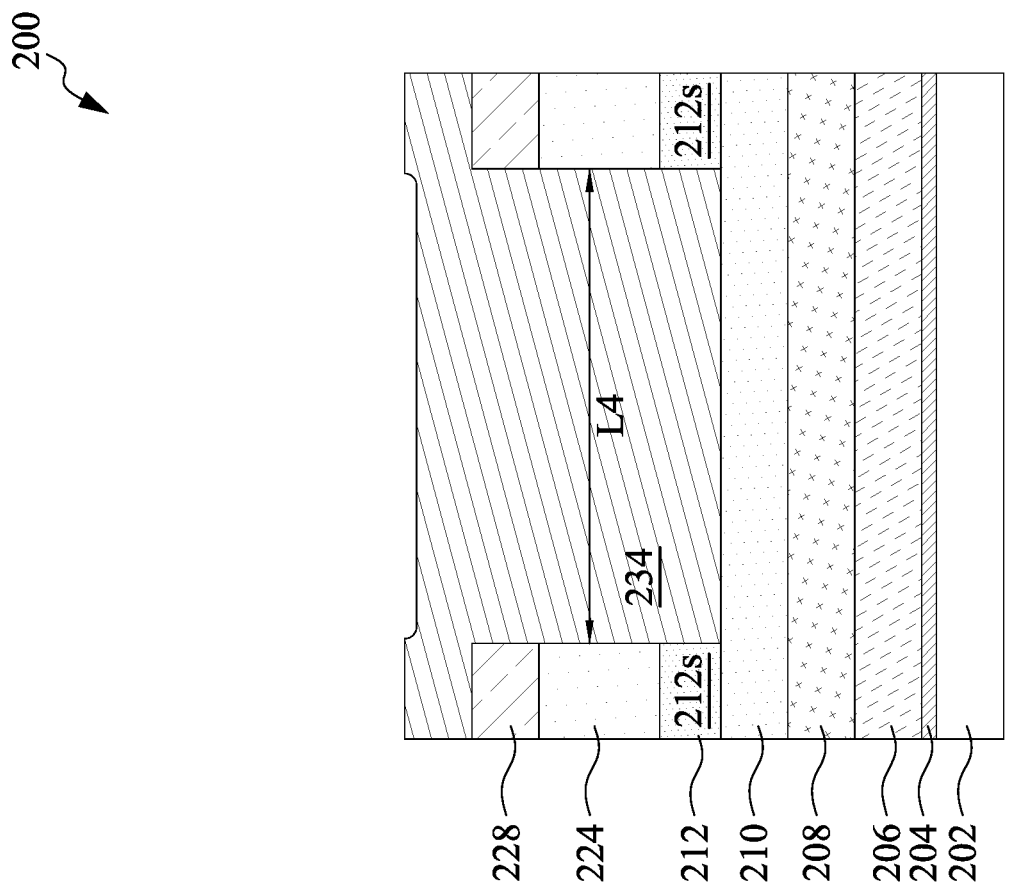

A mask material may be used to fill the cut openings 228ol, 228os in the ARC layer 228 and the cut openings 224ol, 224os in the second protective mask layer 224 as shown in FIGS. 9A-C. The mask material may have properties similar to those of the materials of the third hard mask layer 212 so that the cut mask 234 and the mask strips 212s are used together as an etching mask for patterning the second hard mask layer 210.

The cut mask 234 may be formed from a material including an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or a combination. In some embodiments, when the second hard mask layer 210 includes titanium nitride, W, Si, titanium oxide, or a metal oxide, the cut mask 234 may be formed from an oxide material, or silicon nitride.

The cut mask 234 may be formed using a process such as CVD, ALD, or the like. In some embodiments, the cut mask 234 is formed by filling the cut openings 228ol, 228os in the ARC layer 228 and the cut openings 224ol, 224os in the second protective mask layer 224 by an ALD process.

Figure 10A:
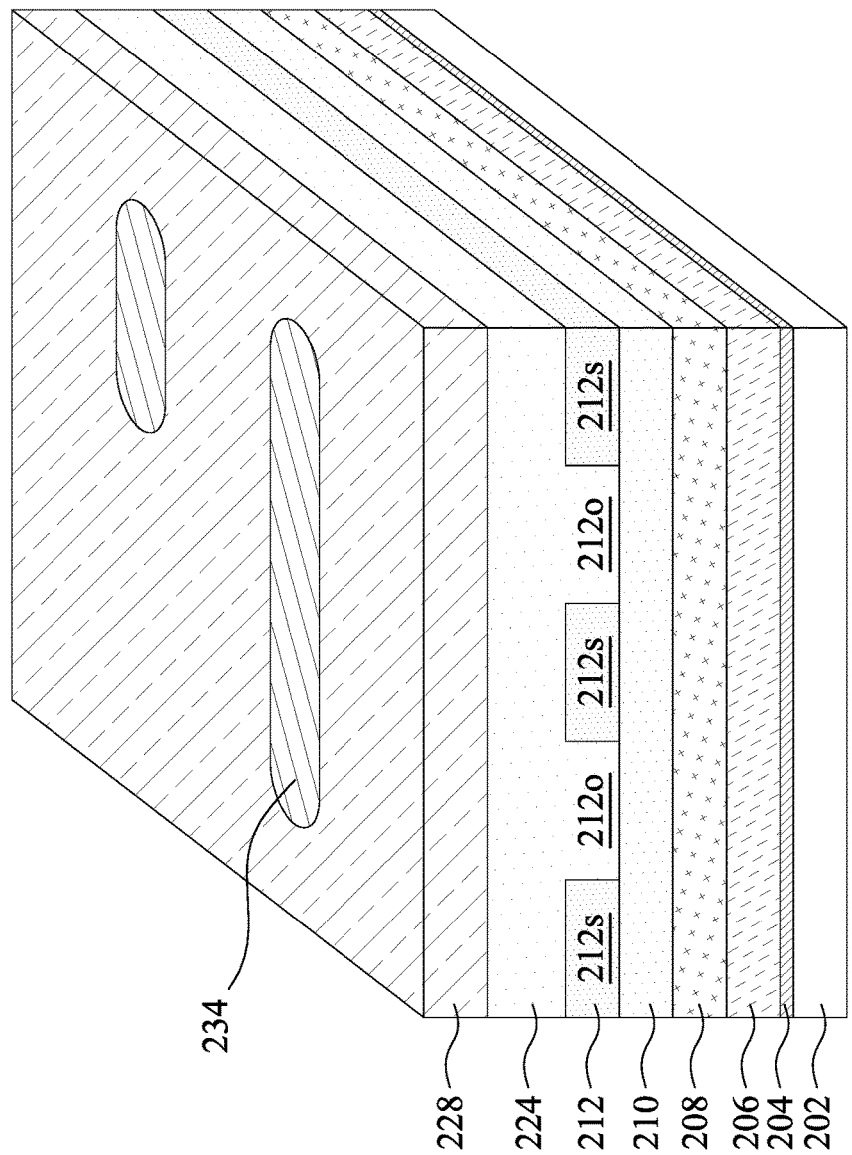
Figure 10C:
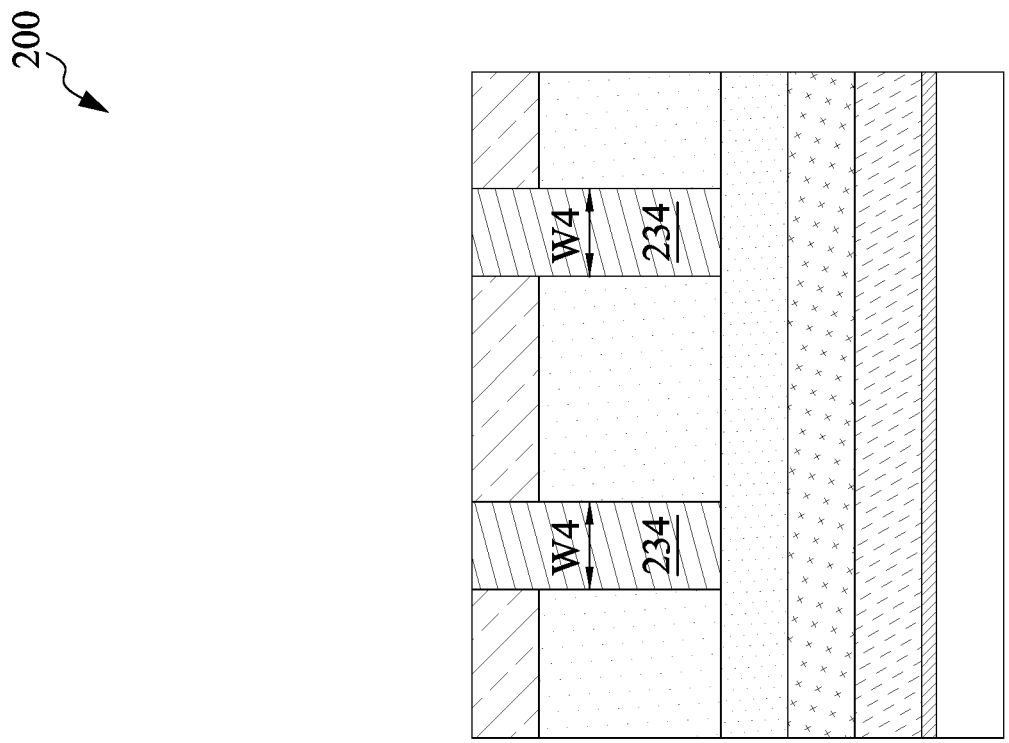
Figure 10B:
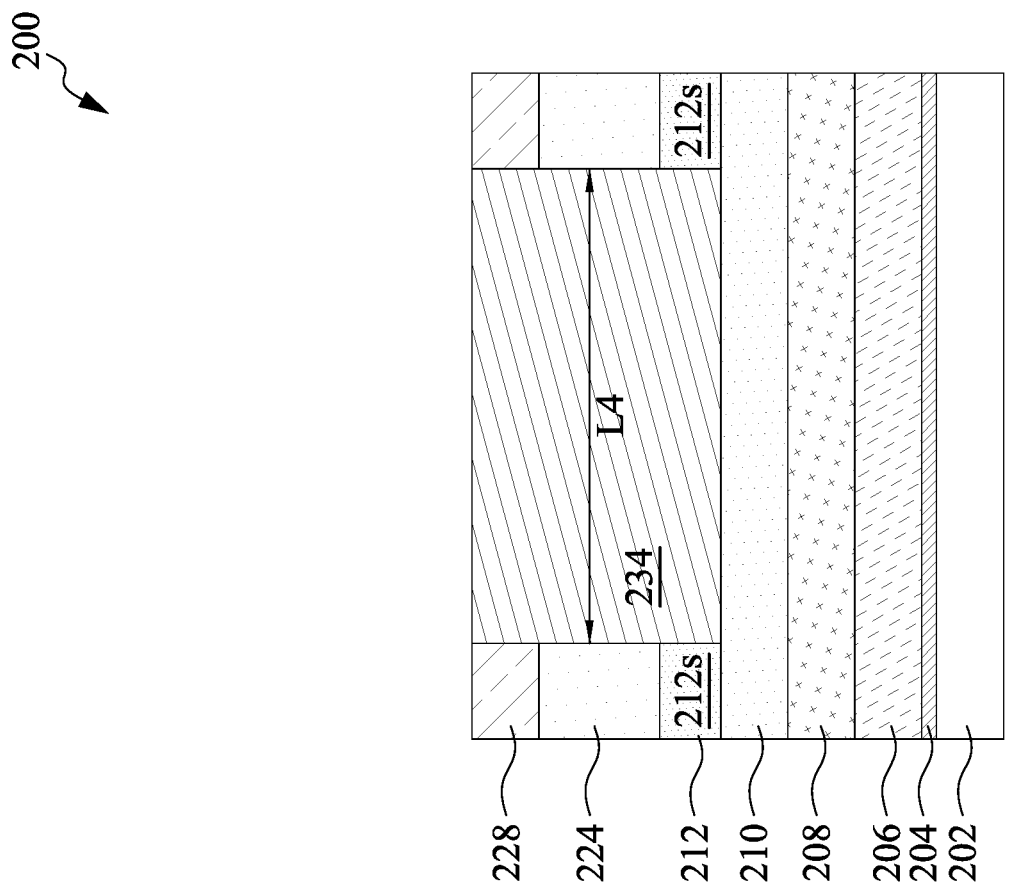

After filling the cut openings 228ol, 228os in the ARC layer 228 and the cut openings 224ol, 224os in the second protective mask layer 224, a planarization process, such as a CMP process is used to expose the ARC layer 228, as shown in FIGS. 10A-C.

Figure 11A:
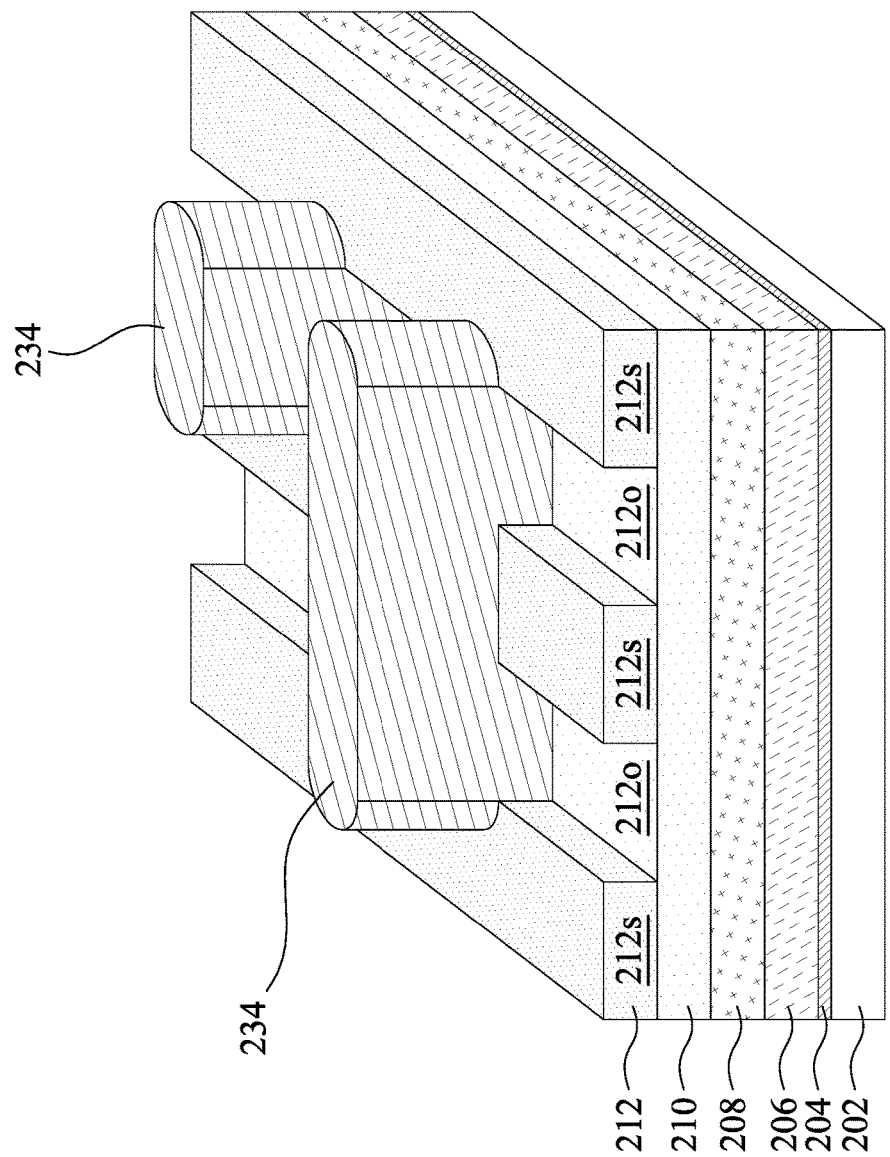
Figure 11C:
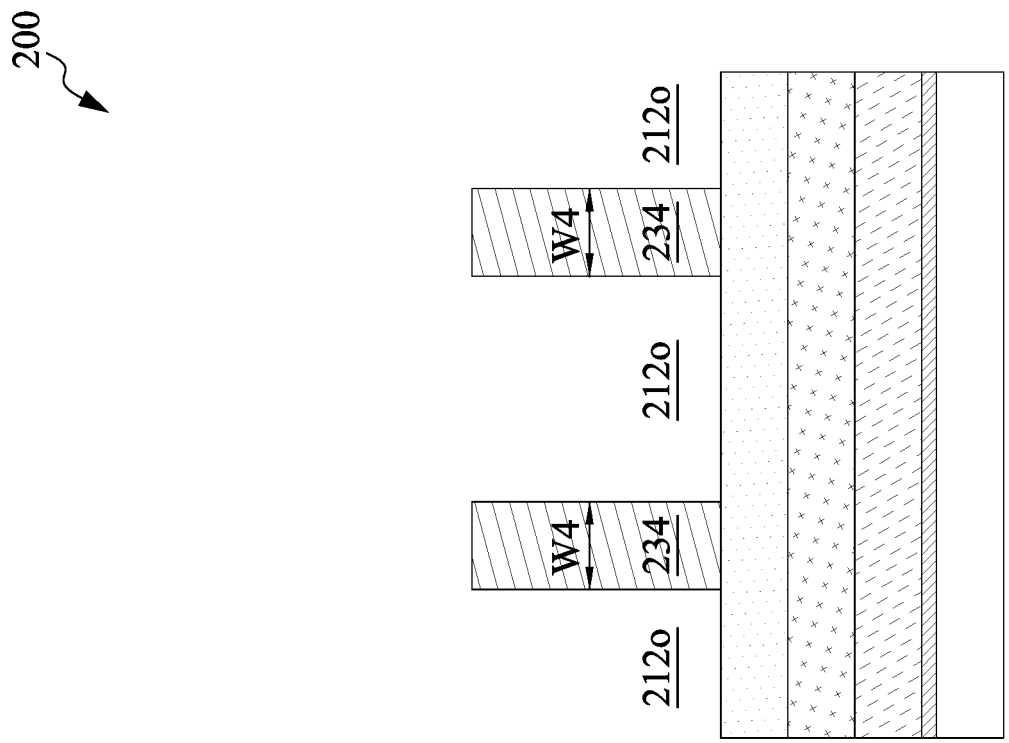
Figure 11B:
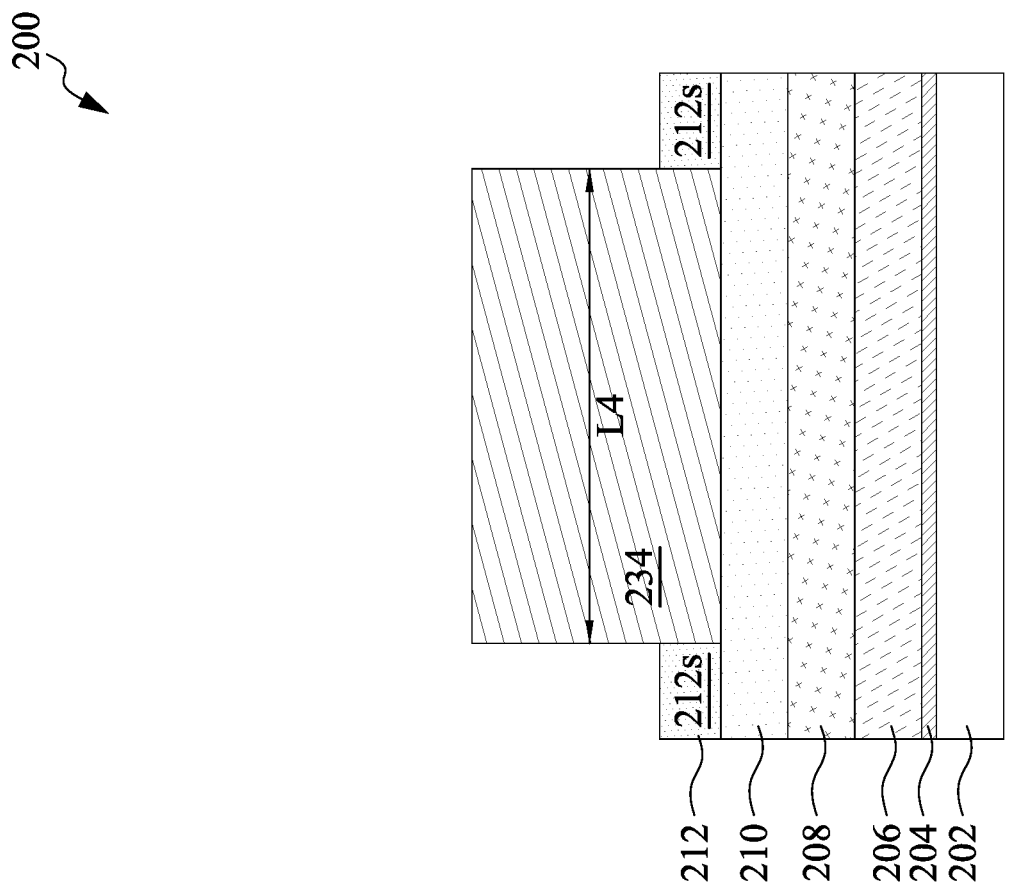

The ARC layer 228 and the second protective mask layer 224 are subsequently removed to expose the cut mask 234, as shown in FIGS. 11A-C. The openings 212o, which are formed in operation 122 in the third mask layer 212, are reformed except portions occupied by the cut mask 234. The cut mask 234 and the mask strips 212s in the third hard mask layer 212 are then used together to pattern the second hard mask layer 210.

Figure 12A:
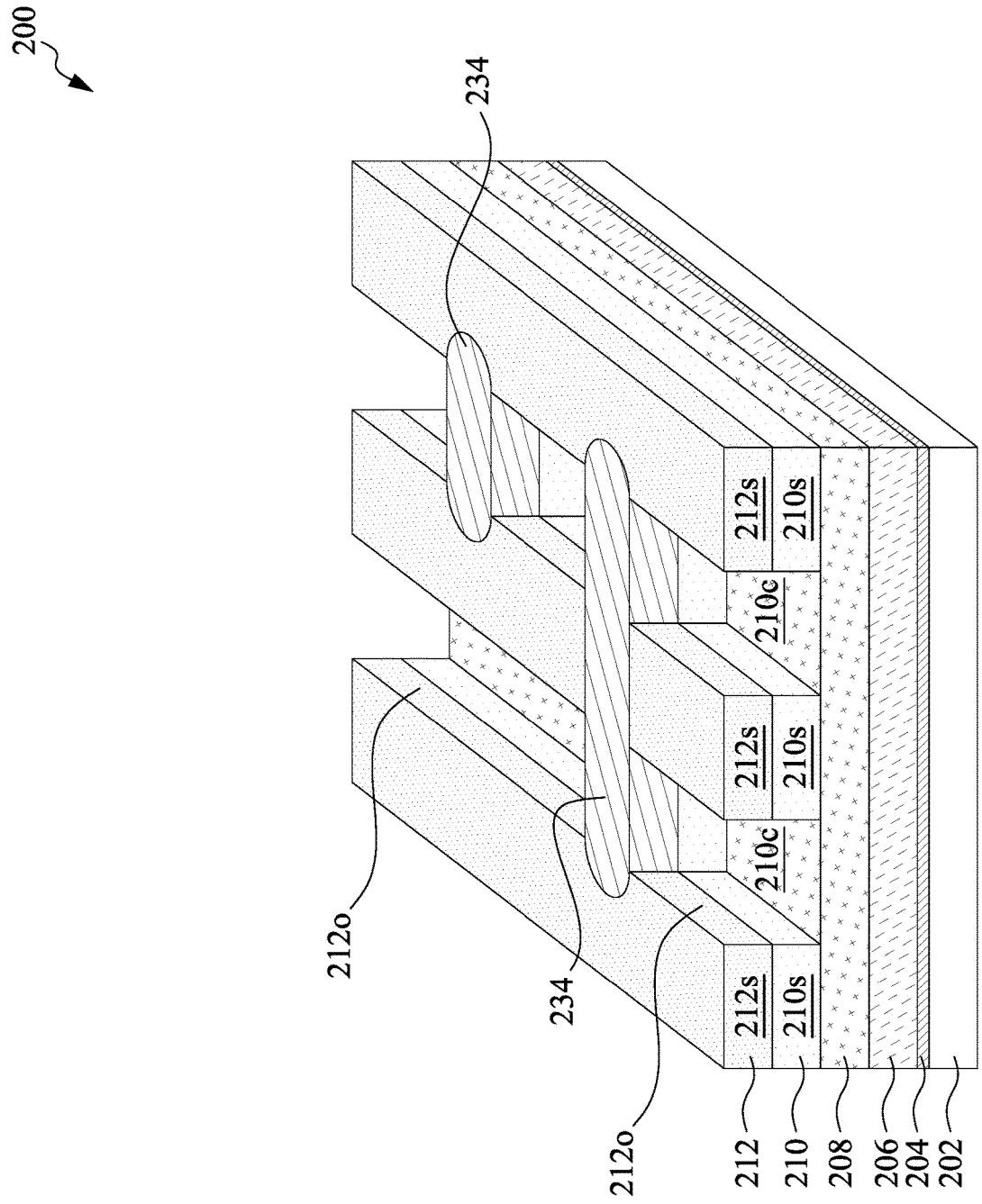
Figure 12C:
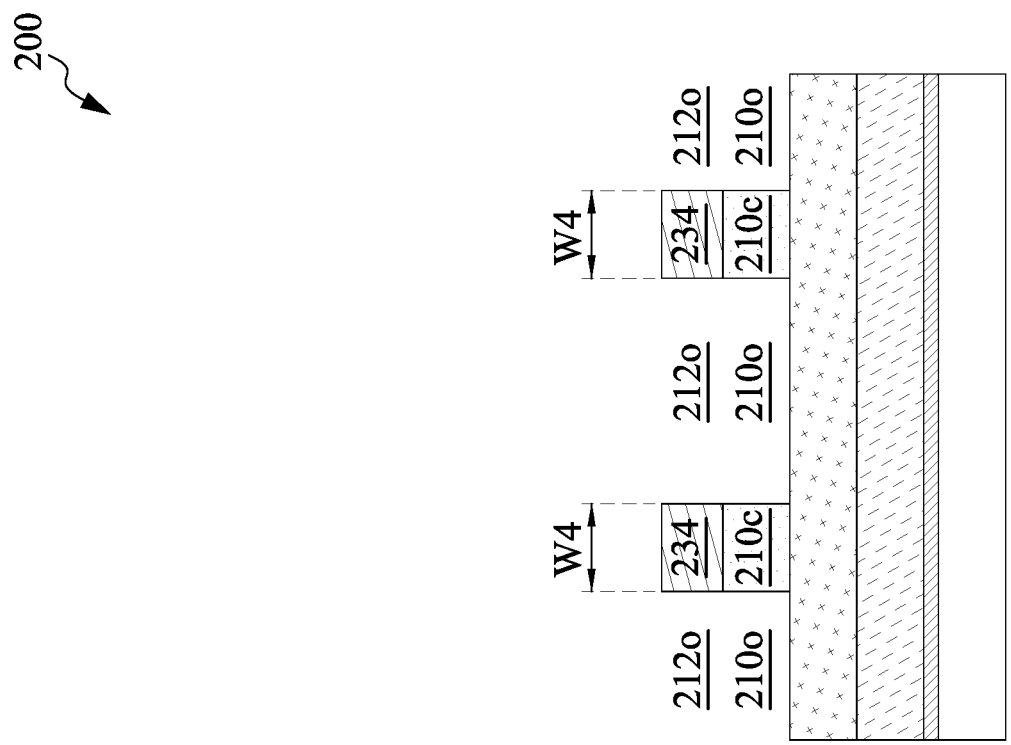
Figure 12B:
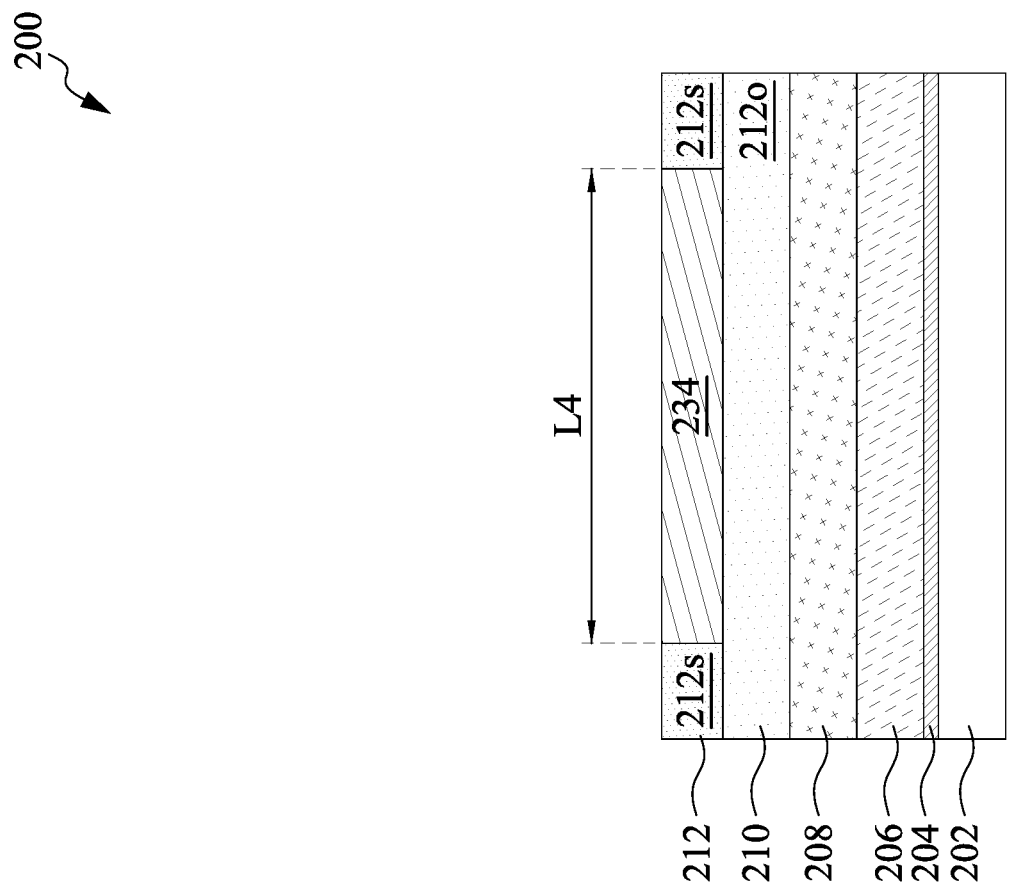

In operation 126 of the method 100, the pattern defined by the mask strips 212s in the third hard mask layer 212 and the cut mask 234 is transferred to the second hard mask layer 210 in an etching process, as shown in FIGS. 12A-C.

The etching process may be anisotropic, so that the openings 212o in the third hard mask layer 212 are extended through the second hard mask layer 210 and have about the same sizes in the second hard mask layer 210 as they do in the third hard mask layer 212. The resulting structure is illustrated in FIGS. 12A-12C. A pattern including mask strips 210s and mask cut features 210c are formed in the second hard mask layer 210. The mask strips 210s and the mask cut features 210c defines a plurality of line openings 210o. The line openings 210o are mostly elongated openings segmented by the mask cut features 210c.

The etching process that etches the second hard mask layer 210 may include a wet etching process, a dry etching process, or a combination thereof. In some embodiments, a dry etching process may be a plasma etching using one or more process gases such as $Cl_2$, $CH_4$, $N_2$, HBr, another type of process gas, or a combination. Other etching techniques may be used in other embodiments. In some embodiments, during the etching of the second hard mask layer 210, portions of the third hard mask layer 212 and the cut mask 234 may remain.

Figure 13:
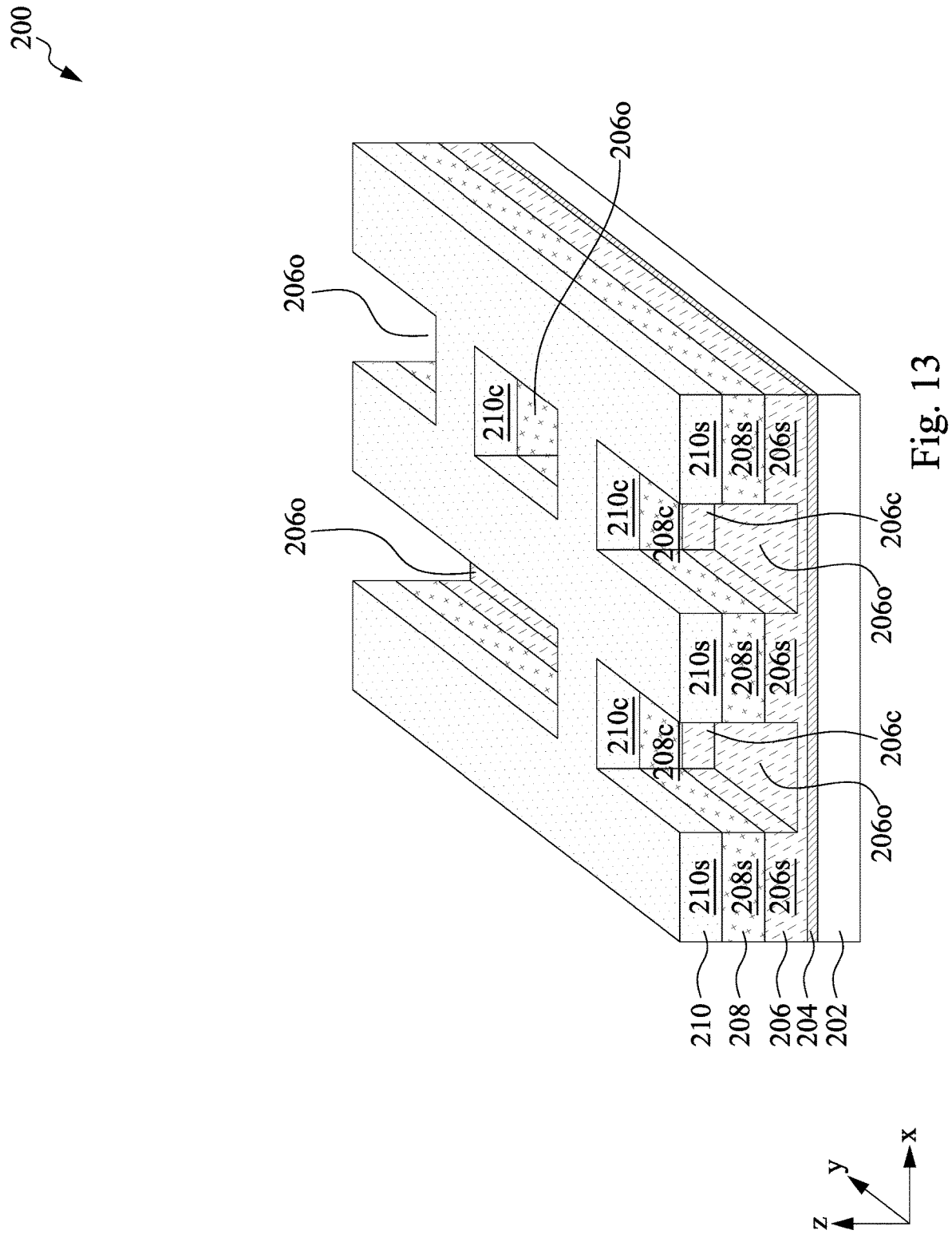
Figure 14:
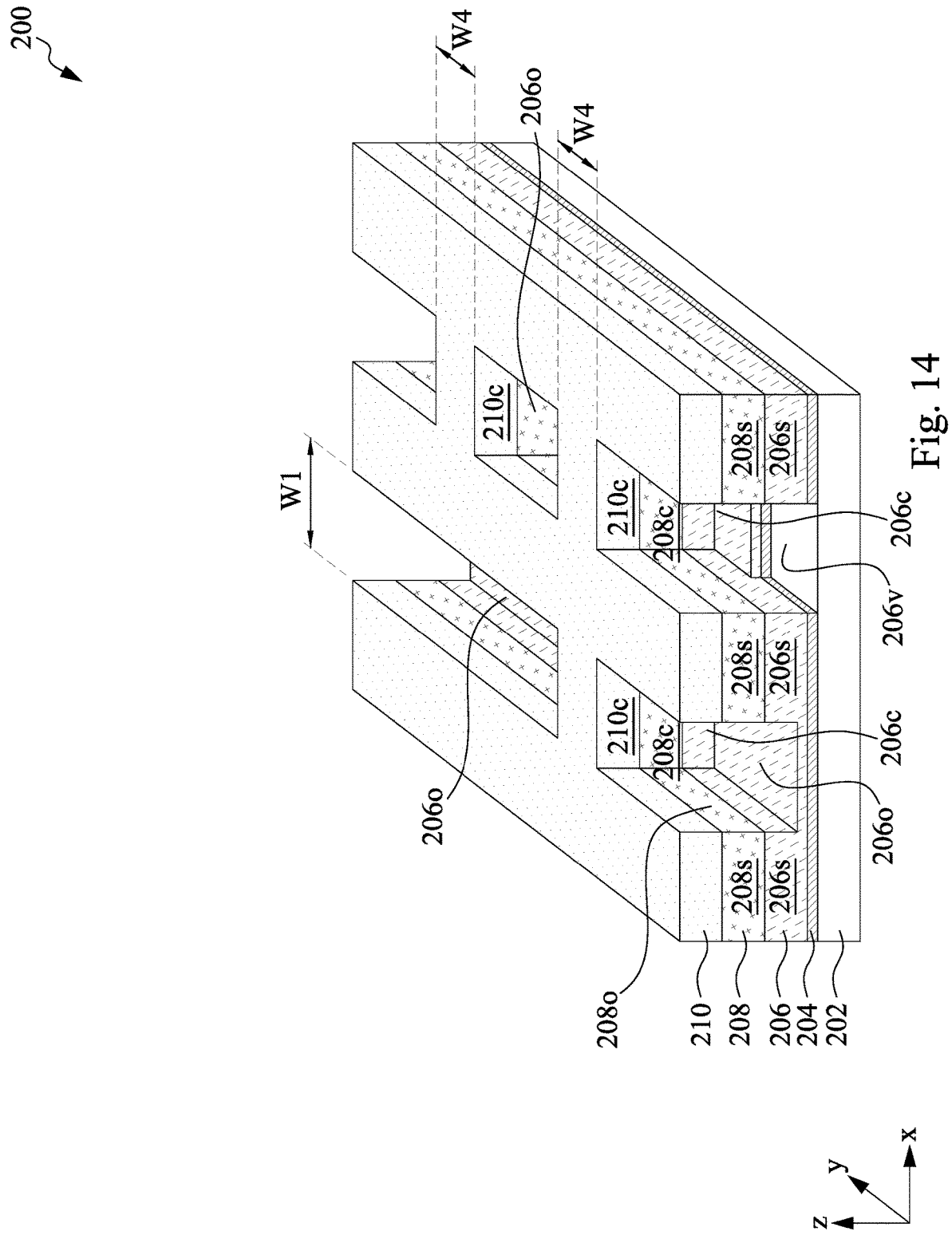

In operation 128 of the method 100, the mask strips 212s in the second hard mask layer 210 and the cut mask 234 are used as an etching mask to extend openings 212o through the first hard mask layer 208 into the dielectric layer 206, thus forming openings 208o in the first hard mask layer 208 and forming openings 206o in the dielectric layer 206, as shown in FIGS. 13, 14. In some embodiments, the openings 206o may be formed through a portion of the dielectric layer 206 as a part of conductive line patterning process, such as a damascene patterning process.

Etching the dielectric layer 206 may include an anisotropic dry etch process and/or a wet etch process, which etches through the first hard mask layer 208 to the dielectric layer 206. In some embodiments, the first hard mask layer 208 is etched in a separate etching step than the etching process to form the openings 206o in the dielectric layer 206. As shown in FIG. 13, the pattern in the second hard mask layer 210 is transferred to the first hard mask layer 208. Unetched portions of the first hard mask layer 208 includes mask strips 208s and mask cut features 208c. Unetched portions of the dielectric layer 206 may have a same pattern as the first hard mask layer 208. Unetched portions of the dielectric layer 206 includes strips 206s and cut features 206c. The strips 206s and the cut features 206c define the openings 206o, where conductive lines are to be formed. Because of the direct transferring of the patterns from the first hard mask layer 208 to the dielectric layer 206, width of the openings 206o along the X-axis is substantially the same as the width W1, and width of the cut features 206c along the Y-axis is substantially the same as the width W4.

After the openings 206o are patterned, a wet cleaning process may be performed to remove any remaining portions of the first hard mask layer 208. In some embodiments, additional patterning process may be performed to form via openings 206v through the dielectric layer 206 and the etch stop layer 204, as shown in FIG. 14. The via openings 206v may expose contacts, metal lines, or other conductive features within beneath the dielectric layer 206, such as conductive features within the substrate 202 or within another layer beneath the dielectric layer 206.

Figure 15A:
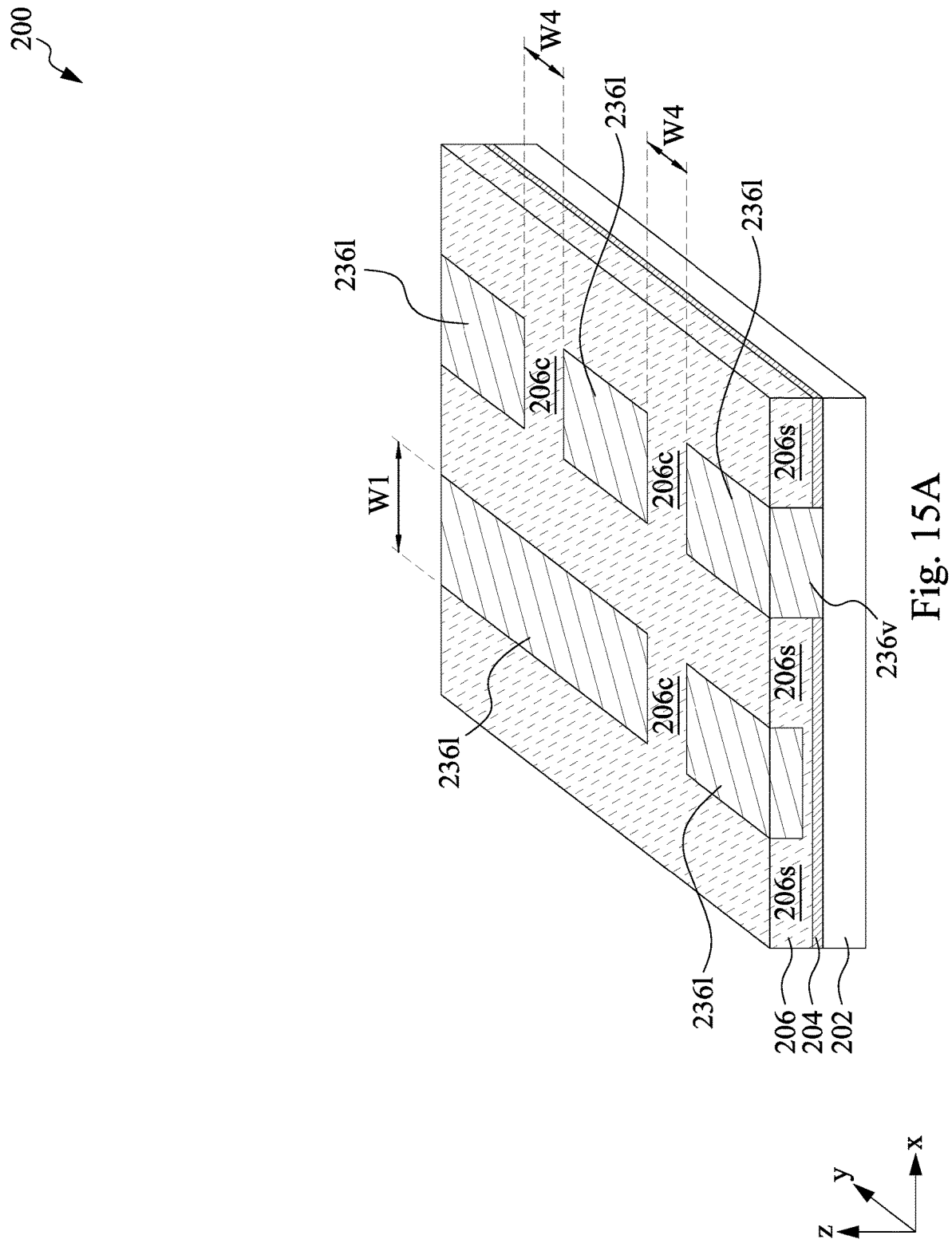
Figure 15C:
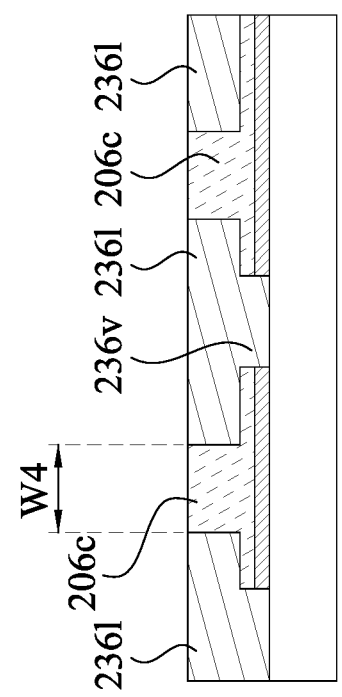
Figure 15B:
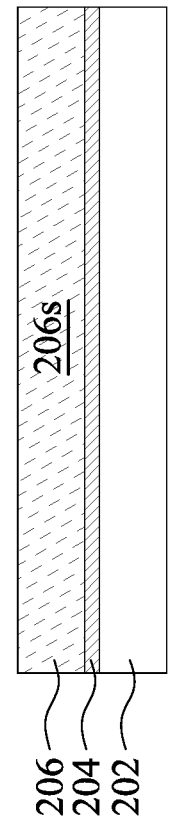

In operation 130 of the specification, conductive lines 236l are formed in the openings 206o patterned in the dielectric layer 206, as shown in FIGS. 15A-C. Conductive vias 236v may be formed in the via openings 206v.

As shown in FIGS. 15A and 15C, width of the conductive lines 236l along the X-axis is substantially the same as the width W1. Two conductive lines 236l may extend along the same line that is parallel the Y-axis, separated by one cut feature 206c at ends of the two conductive lines. As discussed above, the width of the cut features 206c along the Y-axis is substantially the same as the width W4.

In some embodiments, the width W1 of the conductive lines 236l corresponds to the line width CD in the semiconductor device 200, and the width W4 corresponds to the line end CD in the semiconductor device 200. As discussed above, during formation of the cut mask 234, the width W4 is reduced to a range between about 80% to about 40% of the width W1. Thus, the line end CD is smaller than line width CD satisfying the design rules for the circuit design. The width W4 or the line end CD, is in a range between about 80% and about 40% of the width W1 or the line width CD. If the line end CD is greater than 80% of the line width CD, design rules for circuit layout may not be well satisfied. If the line end CD is less than 40% of the line width CD, the cut features 206c may not provide enough isolation function between the conductive lines 236l. In some embodiments, the width W1, or the line end CD of the semiconductor device 200, is between about 15 nm to about 25 nm, and the width W4 is less than about 12 nm, for example, in a range between about 12 nm and about 6 nm.

The conductive lines 236l and conductive vias 236v may be formed by filling the openings 206o and via openings 206v with a conductive material. The conductive material may include Co, Cu, Ag, Al, TiN, TaN, Ta, Ti, Hf, Zr, Ni, W, Zn, Ca, Au, Mg, Mo, Cr, or the like. The conductive material may be formed by CVD, PVD, plating, ALD, or other suitable technique. In some embodiments, one or more liners, not shown, may be formed along sidewalls and a bottom surface of the openings 206o and via openings 206v prior to filling the conductive material, and the conductive lines 236l and conductive vias 236v includes one or more liners and the conductive filling material. The liners may include TiO, TiN, TaO, TaN, or the like, and may provide diffusion barrier, adhesion, and/or seed layers for the conductive lines.

Subsequently, a CMP process is performed to remove excessive conductive material and expose the dielectric layer 206. After operation 130, interconnect structure or bond pad layer may be formed over the dielectric layer 206 according to the circuit design.

Figure 16B:
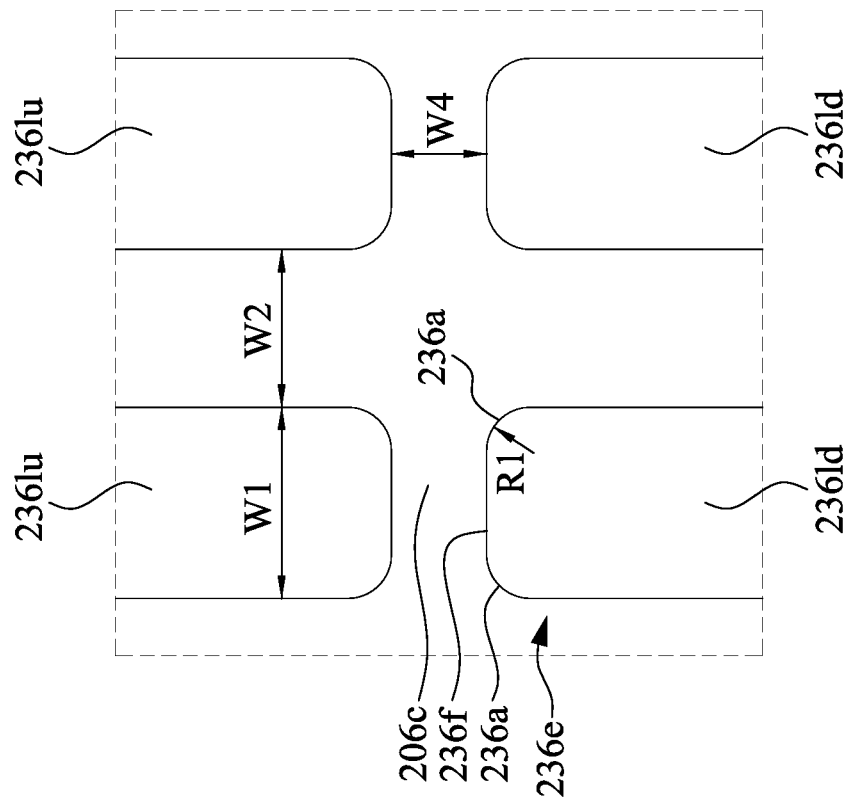
FIG. 16B is a partial enlarged view of the inter-meal dielectric layer of FIG. 16A.
Figure 16A:
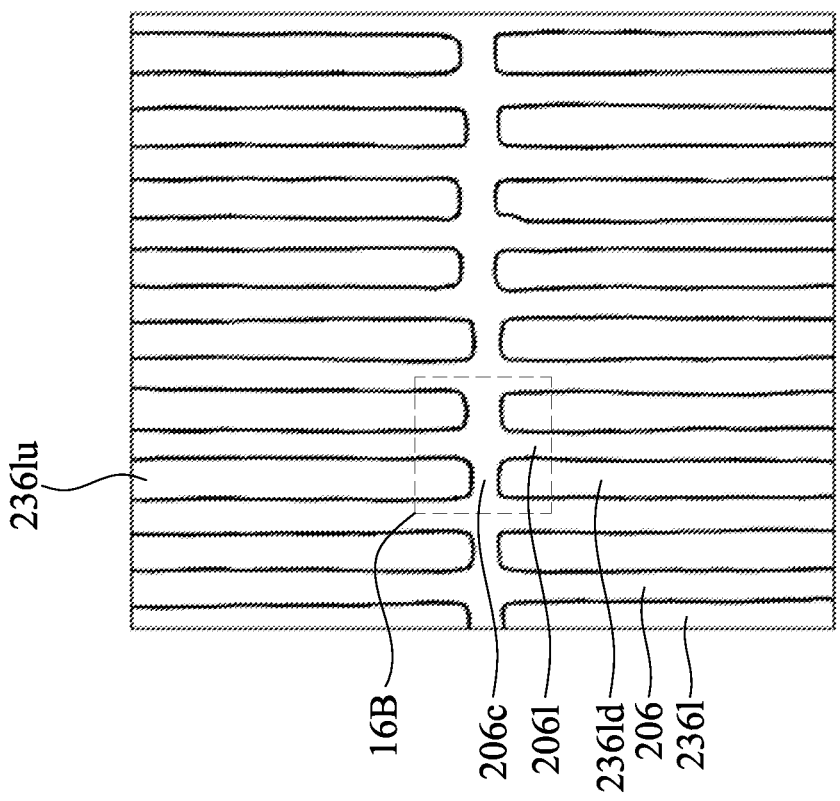
FIG. 16A is a schematic plan view of an inter-metal dielectric layer according to embodiments of the present disclosure.

Semiconductor devices according to the present disclosure not only have with improved line end CD but also have improved line end profiles. FIG. 16A is a schematic plan view of an example of the dielectric layer 206 with the conductive lines 236l according to embodiments of the present disclosure. FIG. 16B is a partial enlarged view of FIG. 16A.

As shown in FIG. 16A, a plurality of conductive lines 236l are formed in the dielectric layer 206. The conductive lines 236l are parallel to each other and neighboring conductive lines 236l are separated by a dielectric strip 206l. Each conductive line 236l is divided into segments 236lu, 236ld by a dielectric cut feature 206c.

As shown in the enlarged view in FIG. 16B, the segments 236lu, 236ld have a line width W1. The line end spacing is W4, and the line spacing is W2. According to embodiments of the present disclosure, the line width W1 is less than about 25 nm, for example in a range between about 15 nm and about 25 nm. The line end spacing W4 is in a range between about 80% of W1 to about 40% of W1. The line spacing W2 is substantially equal to the line width W1, or in a range between about 15 nm and about 25 nm.

Each segment 236ld, 236lu of the conductive line 236l has an end portion 236e of facing the cut feature 206c. The end portion 236e has a relatively flat profile compared to the line ends formed by the current technology. Particularly, the end portion 236e has a profile including two corners 236a connected by a flat section 236f. The corners 236a may have a radius R1. In some embodiments, the radius R1 may be less than about 20% of the line width W1 and the flat section 236f may be greater than about 60% of the line width W1. With relative flat end portion 236e, the segments 236ld, 236lu of the conductive lines 236l improves performance of the semiconductor devices.

Various embodiments or examples described herein offer multiple advantages over the state-of-art technology. Embodiments of the present disclosure shrinks line end spacing to better satisfy design rules for circuit layout. Conductive lines according to the present disclosure also provide a flatter line end profile for the conductive lines near cut features, therefore, improving device performance.

It will be understood that not all advantages have been necessarily discussed herein, no particular advantage is required for all embodiments or examples, and other embodiments or examples may offer different advantages.

Some embodiments of the present disclosure provide a method. The method includes depositing a first hard mask layer over a dielectric layer, forming a plurality of mask strips in the first hard mask layer, wherein the plurality of mask strips are separated by a plurality of openings, filling a first material in the plurality of openings between the plurality of mask strips, forming a cut opening through the first material, filling the cut opening with a second material, removing the first material to expose the second material and the plurality of mask strips, and patterning the dielectric layer using the plurality of mask strips and the second material.

Some embodiments of the present disclosure provide a method. The method include depositing a first hard mask layer, depositing a second hard mask layer on the first hard mask layer, patterning the second hard mask layer to form a plurality of mask strips over the first hard mask layer, wherein the plurality of mask strips extend along a first direction, depositing a mask layer over the plurality of mask strips and the first hard mask layer, depositing a photoresist over the mask layer, patterning the photoresist to form a cut opening to expose at least one of the plurality of mask strips, forming a cut mask in the cut opening, wherein the cut mask extends along a second direction substantially perpendicular to the first direction, removing the mask layer and the photoresist, and patterning the first hard mask layer using the plurality of mask strips and the cut mask as etching masks.

Some embodiments of the present disclosure provide a semiconductor device. The semiconductor device includes a dielectric layer, and a first conductive line formed in the dielectric layer, and a second conductive line formed in the dielectric layer, wherein the first and second conductive lines extend along the same direction, an end portion of the first conductive line faces an end portion of the second conductive line, an end spacing between the end portions of the first and second conductive lines is less than a line width of the first conductive line, and the line width is less than about 25 nm.

Some embodiments of the present disclosure include a method. The method includes depositing a dielectric layer, patterning the dielectric layer using extreme ultraviolet (EUV) patterning technology to form a first opening and a second opening in the dielectric layer, and filling the first and second openings in the dielectric layer to form a first conductive line and a second conductive line in the dielectric layer, wherein the first and second conductive lines extend along the same direction, an end portion of the first conductive line faces an end portion of the second conductive line, an end spacing between the end portions of the first and second conductive lines is less than a line width of the first conductive line, and the line width is less than about 25 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising,
depositing a first hard mask layer over a dielectric layer;
forming a plurality of mask strips in the first hard mask layer, wherein the plurality of mask strips are separated by a plurality of openings;
filling a first material in the plurality of openings between the plurality of mask strips;
forming a cut opening through the first material and above the dielectric layer, wherein forming the forming the cut opening in the first material comprises:
 forming a first opening having a first width in a photoresist layer; and
 performing an etching process using a dimension reduction etching agent to transfer the first opening in the photoresist layer to the first material to form the cut opening, wherein the cut opening has a second width, and the second width is smaller than the first width;
depositing a BARC layer over the first material prior to forming the first opening in the photoresist layer;
etching the BARC layer using the dimension reduction etching agent to form a second opening having the second width; and
patterning the first material using the BARC layer;
filling the cut opening with a second material;
removing the first material to expose the second material and the plurality of mask strips; and
patterning the dielectric layer using the plurality of mask strips and the second material.

2. The method of claim 1, further comprising:
filling a conductive material in the dielectric layer after patterning the dielectric layer.

3. The method of claim 2, wherein the plurality of mask strips extend lengthwise along a first direction, the cut opening extends lengthwise along a second direction perpendicular to the first direction, and the cut opening intersects with two or more mask strips.

4. The method of claim 1, wherein filling the first material in the plurality of openings comprises forming a protective mask layer over the plurality of mask strips using the first material.

5. The method of claim 1, further comprising: prior to forming first hard mask layer,
depositing a second hard mask layer on the dielectric layer; and
depositing a third hard mask layer on the second hard mask layer, wherein the first hard mask layer is formed on the third hard mask layer.

6. The method of claim 5, wherein patterning the dielectric layer comprises:
patterning the third hard mask layer using the plurality of mask strips and the second material;
patterning the second hard mask layer using the third hard mask layer; and
patterning the dielectric layer using the second hard mask layer.

7. The method for claim 1, wherein a width of the first opening substantially equals a width of the plurality of mask strips, and a width of the cut opening is in a range between about 80% to about 40% of the width of the first opening.

8. The method of claim 1, wherein a width of the first opening substantially equals a width of the plurality of mask strips.

9. A method, comprising:
depositing a first hard mask layer;
depositing a second hard mask layer on the first hard mask layer;
patterning the second hard mask layer to form a plurality of mask strips over the first hard mask layer, wherein the plurality of mask strips extend along a first direction;
depositing a mask layer over the plurality of mask strips and the first hard mask layer;
depositing a photoresist layer over the mask layer;
patterning the photoresist layer to form a cut opening to expose at least one of the plurality of mask strips;
forming a cut mask in the cut opening, wherein the cut mask extends along a second direction substantially perpendicular to the first direction; and
patterning the first hard mask layer using the plurality of mask strips and the cut mask as etching masks.

10. The method of claim 9, wherein forming the cut mask comprising filling the cut opening with a mask material.

11. The method of claim 9, wherein patterning the photoresist layer to form the cut opening comprises:
forming a first opening in the photoresist layer, wherein a width of the first opening substantially equals a width of the plurality of mask strips; and
forming the cut opening in the mask layer using the photoresist layer as an etching mask using a dimension reduction etching agent so that the cut opening is narrower than the first opening.

12. The method of claim 9, further comprising:
forming a first opening in the photoresist layer;
forming a second opening in a BARC layer formed on the mask layer using the photoresist layer as an etching mask, wherein the second opening is narrower than the first opening; and
forming the cut opening in the mask layer using the BARC layer as an etching mask.

13. The method of claim 12, wherein the cut opening is narrower than the second opening.

14. The method for claim 12, wherein a width of the first opening substantially equals a width of the plurality of mask strips, and a width of the cut opening is in a range between about 80% to about 40% of the width of the first opening.

15. A method, comprising:
depositing a dielectric layer;

patterning the dielectric layer using extreme ultraviolet (EUV) patterning technology to form a first opening and a second opening in the dielectric layer; and filling the first and second openings in the dielectric layer to form a first conductive line and a second conductive line in the dielectric layer, wherein the first and second conductive lines extend along the same direction, an end portion of the first conductive line faces an end portion of the second conductive line, an end spacing between the end portions of the first and second conductive lines is less than a line width of the first conductive line, and the line width is less than about 25 nm, wherein the end portion of the first conductive line includes a profile comprising:
 a first corner;
 a second corner; and
 a flat portion connecting the first and second corner, wherein a length of the flat portion is between about 60% to about 80% of the line width.

16. The method of claim 15, wherein the end spacing is in a range between about 80% and about 40% of the line width.

17. The method of claim 15, wherein the end spacing is less than 50% of the line width.

18. The method of claim 16, wherein patterning the dielectric layer further comprises forming a third opening in the dielectric layer, and filling the third opening to form a third conductive line parallel to the first conductive line, a line spacing between the first and third conductive lines are substantially equal to the line width.

19. The method of claim 15, wherein a radius of the first corner is less than about 20% of the line width.

20. The method of claim 15, wherein patterning the dielectric layer using extreme ultraviolet (EUV) patterning technology to form the first opening and send second opening in the dielectric layer comprises:
 depositing a first hard mask layer over the dielectric layer;
 forming a plurality of mask strips in the first hard mask layer, wherein the plurality of mask strips are separated by a plurality of openings;
 filling a first material in the plurality of openings between the plurality of mask strips;
 forming a cut opening through the first material and above the dielectric layer;
 filling the cut opening with a second material;
 removing the first material to expose the second material and the plurality of mask strips; and
 patterning the dielectric layer using the plurality of mask strips and the second material.

* * * * *